United States Patent
Cardolaccia et al.

(10) Patent No.: US 11,809,077 B2
(45) Date of Patent: Nov. 7, 2023

(54) PHOTORESIST COMPOSITIONS AND PATTERN FORMATION METHODS

(71) Applicant: ROHM AND HAAS ELECTRONIC MATERIALS LLC, Marlborough, MA (US)

(72) Inventors: Thomas Cardolaccia, Natick, MA (US); Jason A. DeSisto, Hopkinton, MA (US); Choong-Bong Lee, Westborough, MA (US); Mingqi Li, Shrewsbury, MA (US); Tomas Marangoni, Marlborough, MA (US); Chunyi Wu, Shrewsbury, MA (US); Cong Liu, Shrewsbury, MA (US); Gregory P. Prokopowicz, Worcester, MA (US)

(73) Assignee: ROHM AND HAAS ELECTRONIC MATERIALS LLC, Marlborough, MA (US)

(*) Notice: Subject to any disclaimer, the term of this patent is extended or adjusted under 35 U.S.C. 154(b) by 216 days.

(21) Appl. No.: 17/198,749

(22) Filed: Mar. 11, 2021

(65) Prior Publication Data
US 2022/0043342 A1 Feb. 10, 2022

Related U.S. Application Data

(60) Provisional application No. 63/058,953, filed on Jul. 30, 2020.

(51) Int. Cl.
*G03F 7/004* (2006.01)
*C08F 220/28* (2006.01)
*C08F 220/18* (2006.01)
*G03F 7/027* (2006.01)

(52) U.S. Cl.
CPC ......... *G03F 7/0045* (2013.01); *C08F 220/18* (2013.01); *C08F 220/281* (2020.02); *G03F 7/027* (2013.01)

(58) Field of Classification Search
CPC .................................................. G03F 7/0045
See application file for complete search history.

(56) References Cited

U.S. PATENT DOCUMENTS

| | | |
|---|---|---|
| 3,644,120 A | 2/1972 | Kai et al. |
| 4,189,323 A | 2/1980 | Buhr |
| 8,431,325 B2 | 4/2013 | Hashimoto et al. |
| 9,513,549 B2 | 12/2016 | Yoshida et al. |
| 2004/0053171 A1 | 3/2004 | Takata et al. |
| 2006/0246373 A1 | 11/2006 | Wang et al. |
| 2012/0077120 A1 | 3/2012 | Prokopowicz et al. |
| 2013/0244178 A1* | 9/2013 | Prokopowicz ........ G03F 7/0045 430/281.1 |
| 2018/0059545 A1* | 3/2018 | Ryu ........................ C07C 69/54 |

FOREIGN PATENT DOCUMENTS

| | | | |
|---|---|---|---|
| JP | 2004043779 A | * | 2/2004 |
| JP | 2004043779 A | | 2/2004 |
| JP | 2008241870 A | * | 10/2008 |
| JP | 2009244778 A | | 10/2009 |
| JP | 2011118198 A | | 6/2011 |
| JP | 2012088459 A | | 5/2012 |
| JP | 2019124941 A | | 7/2019 |
| KR | 1020100072921 B1 | | 5/2018 |

OTHER PUBLICATIONS

English translation of JP2004043779. (Year: 2004).*
English translation of JP2008241870. (Year: 2008).*
Mack, "Fundamental Principles of Optical Lithography"; John Wiley and Sons, Inc.; Chapter 1; 2007, pp. 1-27.
Okoroanyanwu; "Chemistry and Lithography"; SPIE Press and John Wiley and Sons, Inc.; Chapter 7; 2010, pp. 285-394.

* cited by examiner

*Primary Examiner* — Cynthia H Kelly
*Assistant Examiner* — Anna Malloy
(74) *Attorney, Agent, or Firm* — CANTOR COLBURN LLP

(57) ABSTRACT

A photoresist composition comprises a first polymer formed by free radical polymerization. The first polymer comprises polymerized units formed from a monomer that comprises an ethylenically unsaturated double bond and an acid-labile group; a photoacid generator; a quencher of formula (1):

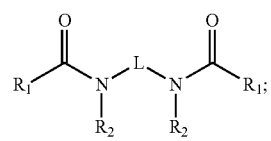

(1)

and a solvent.

11 Claims, No Drawings

PHOTORESIST COMPOSITIONS AND PATTERN FORMATION METHODS

CROSS REFERENCE TO RELATED APPLICATIONS

This application claims the benefit of U.S. Provisional Application Ser. No. 63/058,953, filed Jul. 30, 2020, the entire disclosure of which is incorporated herein by reference.

BACKGROUND

This disclosure relates to photoresist compositions comprising a diamide quencher and to pattern formation methods using such photoresist compositions. More specifically, the photoresist compositions have particular applicability in the electronics industry to the manufacture of semiconductor devices.

Photoresist materials are photosensitive compositions that are used for transferring an image to one or more underlying layers such as a metal, semiconductor or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

Chemically amplified photoresists are conventionally used for high-resolution processing. Such resists typically employ a polymer having acid-labile groups and a photoacid generator. Pattern-wise exposure to activating radiation through a photomask causes the acid generator to form an acid which, during post-exposure baking, causes cleavage of the acid-labile groups in exposed regions of the polymer. This creates a difference in solubility characteristics between exposed and unexposed regions of the resist in a developer solution. In a positive tone development (PTD) process, exposed regions of the photoresist layer become soluble in the developer and are removed from the substrate surface, whereas unexposed regions, which are insoluble in the developer, remain after development to form a positive image. In a negative tone development (NTD) process, exposed regions of the photoresist layer become insoluble in the developer and remain after development to form a negative image. The resulting relief image permits selective processing of the substrate. See, e.g., Uzodinma Okoroanyanwu, Chemistry and Lithography, SPIE Press and John Wiley and Sons, Inc., 2010 and Chris Mack, Fundamental Principles of Optical Lithography, John Wiley and Sons, Inc., 2007.

One approach to achieving nanometer-scale feature sizes in semiconductor devices is the use of short wavelengths of light, for example, 248 nanometers (nm) or less, during exposure of chemically amplified photoresists. To further improve lithographic performance, immersion lithography tools have been developed to effectively increase the numerical aperture (NA) of the lens of the imaging device, for example, a scanner having a KrF (248 nm) or ArF (193 nm) light source. This is accomplished by use of a relatively high refractive index fluid, typically water, between the last surface of the imaging device and the upper surface of the semiconductor wafer. However, as lithographic resolution becomes increasingly higher, linewidth roughness (LWR), critical dimension uniformity (CDU) and depth of focus (DoF) of the photoresist patterns have become of increased importance in forming high-fidelity patterns.

In a lithographic process, it is important that the point of focus of the light source into the film be tightly controlled, as this largely determines the vertical concentration of acid created from the photoacid generator. This, in turn, impacts the critical dimension (CD) of the pattern as well as LWR and the generation of defects. While lithographic tools have become increasingly precise in controlling the point of light focus, it is also desirable that the photoresist exhibits a wide depth of focus. The depth of focus is the tolerance for an unwanted change in focus within the photoresist layer that results in an acceptable change in the obtained pattern CD, typically +/−10% CD. For this, photo-generated acid diffusion within the photoresist layer uses precise control and should be matched to balance other resist attributes, such as photo-speed. If acid diffusion is too fast or non-homogenous, areas of the film may exhibit differences in acid concentration, which can lead to differences in CD and LWR and can give rise to defects.

There are examples in the literature of photoresist compositions with improved depth of focus and controlled acid diffusion. For example, U.S. Pat. No. 9,513,549 discloses photoresist compositions with a polymer matrix comprising a protected polar group. That document discloses that a wider depth of focus was observed due to the improved acid diffusion control of the photoresist.

There is a need in the art for photoresist compositions and patterning methods useful in electronic device fabrication that address one or more problems associated with the state of the art.

SUMMARY

Disclosed herein is a photoresist composition, comprising a first polymer formed by free radical polymerization, the first polymer comprising polymerized units formed from a monomer comprising an ethylenically unsaturated double bond and an acid-labile group; a photoacid generator; a quencher of formula (1):

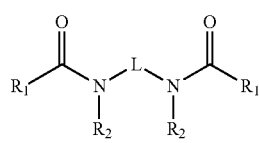

(1)

wherein: $R_1$ is independently a hydrogen atom, $C_1$-$C_{20}$ linear, $C_3$-$C_{20}$ branched, or $C_{3\text{-}20}$ cyclic alkyl, the alkyl optionally comprising an —O— group other than at an alpha-position with respect to the amide C(O), or $C_6$-$C_{20}$ aryl; $R_2$ is independently a hydrogen atom, $C_1$-$C_{20}$ linear, $C_3$-$C_{20}$ branched, or $C_3$-$C_{20}$ cyclic alkyl, or $C_6$-$C_{20}$ aryl; L is $C_1$-$C_{20}$ linear or $C_3$-$C_{20}$ branched alkylene comprising one or more heteroatom-containing groups independently selected from —O—, —S—, or —N($R_3$)—, wherein $R_3$ is selected from a hydrogen atom or $C_1$-$C_{20}$ linear or $C_3$-$C_{20}$ branched or cyclic alkyl; each of $R_1$, $R_2$, and L may independently be substituted or unsubstituted; wherein the quencher is free of crosslinkable groups; and a solvent.

DETAILED DESCRIPTION

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise.

As used herein, an "acid-labile group" refers to a group in which a bond is cleaved by the catalytic action of an acid, optionally and typically with thermal treatment, resulting in a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

"Substituted" means that at least one hydrogen atom on the group is replaced with another atom or group, provided that the designated atom's normal valence is not exceeded. When the substituent is oxo (i.e., =O), then two hydrogens on the carbon atom are replaced. Combinations of substituents or variables are permissible. Exemplary groups that may be present on a "substituted" position include, but are not limited to, nitro (—NO$_2$), cyano (—CN), hydroxy (—OH), oxo (=O), amino (—NH$_2$), mono- or di-(C$_{1-6}$) alkylamino, alkanoyl (such as a C$_{2-6}$ alkanoyl group such as acyl), formyl (—C(=O)H), carboxylic acid or an alkali metal or ammonium salt thereof; esters (including acrylates, methacrylates, and lactones) such as C$_{2-6}$ alkyl esters (—C(=O)O-alkyl or —OC(=O)-alkyl) and C$_{7-13}$ aryl esters (—C(=O)O-aryl or —OC(=O)-aryl); amido (—C(=O)NR$_2$ wherein R is hydrogen or C$_{1-6}$ alkyl), carboxamido (—CH$_2$C(=O)NR$_2$ wherein R is hydrogen or C$_{1-6}$ alkyl), halogen, thiol (—SH), C$_{1-6}$ alkylthio (—S-alkyl), thiocyano (—SCN), C$_{1-6}$ alkyl, C$_{2-6}$ alkenyl, C$_{2-6}$ alkynyl, C$_{1-6}$ haloalkyl, C$_{1-9}$ alkoxy, C$_{1-6}$ haloalkoxy, C$_{3-12}$ cycloalkyl, C$_{5-18}$ cycloalkenyl, C$_{6-12}$ aryl having at least one aromatic ring (e.g., phenyl, biphenyl, naphthyl, or the like, each ring either substituted or unsubstituted aromatic), C$_{7-19}$ arylalkyl having 1 to 3 separate or fused rings and from 6 to 18 ring carbon atoms, arylalkoxy having 1 to 3 separate or fused rings and from 6 to 18 ring carbon atoms, C$_{7-12}$ alkylaryl, C$_{4-12}$ heterocycloalkyl, C$_{3-12}$ heteroaryl, C$_{1-6}$ alkyl sulfonyl (—S(=O)$_2$-alkyl), C$_{6-12}$ arylsulfonyl (—S(=O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a C$_2$ alkyl group substituted with a cyano group.

Disclosed herein is a photoresist composition that comprises a first polymer formed by free radical polymerization, the first polymer comprising polymerized units formed from a monomer comprising an ethylenically unsaturated double bond and an acid-labile group, a photoacid generator, a solvent and a diamide quencher that contains heteroatoms in a bridge that bonds the two amide groups. In an embodiment, the heteroatoms may comprise oxygen, nitrogen, sulfur, or a combination thereof. It is believed that the presence of the two amide groups and heteroatom-containing linker in the quenchers can effectively quench (neutralize) photo-generated acid that would otherwise diffuse from exposed to unexposed resist layer regions, allowing for desired properties, for example, increased depth-of-focus and reduced roughness.

The first polymer is an acid-sensitive polymer preferably formed by free radical polymerization and comprises polymerized units formed from a monomer that comprises an ethylenically unsaturated double bond and an acid-labile group. The first polymer is typically a copolymer comprising two or more different repeat units. The copolymer may be a random copolymer, a block copolymer, a star block copolymer, a gradient copolymer, or the like, with a random copolymer being preferred.

The monomer comprising an acid-labile group may be of formulas (1a), (1b), (1c), or (1d):

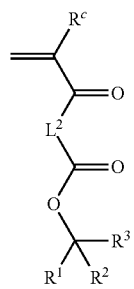
(1a)

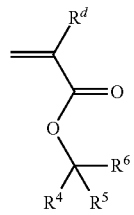
(1b)

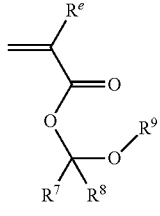
(1c)

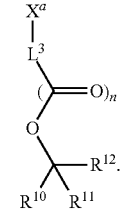
(1d)

In formulas (1a) and (1b), $R^c$ and $R^d$ are each independently hydrogen, fluorine, cyano, substituted or unsubstituted C$_{1-10}$ alkyl, or substituted or unsubstituted C$_{1-10}$ fluoroalkyl. Preferably, $R^c$ is hydrogen, fluorine, or a substituted or unsubstituted C$_{1-5}$ alkyl, typically methyl.

In formula (1a), $L^2$ is a divalent linking group including at least one carbon atom, at least one heteroatom, or a combination thereof. For example, $L^2$ may include 1 to 10 carbon atoms and at least one heteroatom. In an embodiment, $L^2$ may be —OCH$_2$—, —OCH$_2$CH$_2$O— or —N(R$^{41}$)—, wherein R$^{41}$ is hydrogen or C$_{1-6}$ alkyl.

In formulas (1a) and (1b), $R^1$ to $R^6$ are each independently hydrogen, straight chain or branched C$_{1-20}$ alkyl, a monocyclic or polycyclic C$_{3-20}$ cycloalkyl, a monocyclic or polycyclic C$_{3-20}$ heterocycloalkyl, a straight chain or branched C$_{2-20}$ alkenyl, a monocyclic or polycyclic C$_{3-20}$ cycloalkenyl, a monocyclic or polycyclic C$_{3-20}$ heterocycloalkenyl, a monocyclic or polycyclic C$_{6-20}$ aryl, or a monocyclic or polycyclic C$_{4-20}$ heteroaryl, each of which is substituted or unsubstituted; provided that only one of R$^1$ to R$^3$ can be hydrogen and only one of R$^4$ to R$^6$ can be hydrogen. Preferably, R$^1$ to R$^6$ are each independently a straight chain or branched C$_{1-6}$ alkyl, or a monocyclic or polycyclic C$_{3-10}$ cycloalkyl, each of which is substituted or unsubstituted.

In formula (1a), any two of R$^1$ to R$^3$ together optionally form a ring, and each of R$^1$ to R$^3$ optionally may include as part of their structure one or more groups selected from —O—, —C(O)—, —C(O)—O—, —S—, —S(O)$_2$—, and —N(R$^{42}$)—S(O)$_2$—, wherein R$^{42}$ may be hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. In formula (1b), any two of $R^4$ to $R^6$ together optionally form a ring, and each of $R^4$ to $R^6$ optionally may include as part of their structure one or more groups selected from —O—, —C(O)—, —C(O)—O—, —S—, —S(O)$_2$—, and —N($R^{43}$)—S(O)$_2$—, wherein $R^{43}$ is hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. For example, any one or more of $R^1$ to $R^6$ can be independently a group of the formula —CH$_2$C(=O)CH$_{(3-n)}Y_n$, where each Y is independently a substituted or unsubstituted $C_{3-10}$ heterocycloalkyl and n is 1 or 2. For example, each Y may be independently a substituted or unsubstituted $C_{3-10}$ heterocycloalkyl including a group of the formula —O($C^{a1}$)($C^{a2}$)O—, wherein $C^{a1}$ and $C^{a2}$ are each independently hydrogen or a substituted or unsubstituted alkyl, and where $C^{a1}$ and $C^{a2}$ together optionally form a ring.

In formula (1c), $R^7$ to $R^8$ may be each independently hydrogen, straight chain or branched $C_{1-20}$ alkyl, a monocyclic or polycyclic $C_{3-20}$ cycloalkyl, a monocyclic or polycyclic $C_{3-20}$ heterocycloalkyl, a monocyclic or polycyclic $C_{6-20}$ aryl, or a monocyclic or polycyclic $C_{4-20}$ heteroaryl, each of which is substituted or unsubstituted; and $R^9$ is straight chain or branched $C_{1-20}$ alkyl, monocyclic or polycyclic $C_{3-20}$ cycloalkyl, or monocyclic or polycyclic $C_{3-20}$ heterocycloalkyl, each of which is substituted or unsubstituted. Optionally, one of $R^7$ or $R^8$ together with $R^9$ forms a heterocyclic ring. Preferably, $R^7$ and $R^8$ may be each independently hydrogen, straight chain or branched $C_{1-20}$ alkyl, monocyclic or polycyclic $C_{3-20}$ cycloalkyl, or monocyclic or polycyclic $C_{3-20}$ heterocycloalkyl.

In formula (1d), $R^{10}$ to $R^{12}$ may be each independently straight chain or branched $C_{1-20}$ alkyl, a monocyclic or polycyclic $C_{3-20}$ cycloalkyl, a monocyclic or polycyclic $C_{3-20}$ heterocycloalkyl, a monocyclic or polycyclic $C_{6-20}$ aryl, or a monocyclic or polycyclic $C_{4-20}$ heteroaryl, each of which is substituted or unsubstituted, any two of $R^{10}$ to $R^{12}$ together optionally form a ring, and each of $R^{10}$ to $R^{12}$ optionally may include as part of their structure one or more groups selected from —O—, —C(O)—, —C(O)—O—, —S—, —S(O)$_2$—, and —N($R^{44}$)—S(O)$_2$—, wherein $R^{44}$ may be hydrogen, a straight chain or branched $C_{1-20}$ alkyl, monocyclic or polycyclic $C_{3-20}$ cycloalkyl, or monocyclic or polycyclic $C_{3-20}$ heterocycloalkyl; $X^a$ is a polymerizable group selected from vinyl and norbornyl; and $L^3$ is a single bond or a divalent linking group, provided that $L^3$ is not a single bond when $X^a$ is vinyl. Preferably, $L^3$ is a monocyclic or polycyclic $C_{6-30}$ arylene or a monocyclic or polycyclic $C_{6-30}$ cycloalkylene, each of which can be substituted or unsubstituted. In formula (1d), n is 0 or 1. It is to be understood that when n is 0, the $L^3$ group is connected directly to the oxygen atom.

Non-limiting examples of monomers (1a) include:

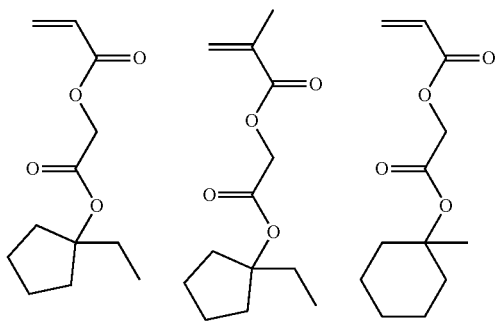

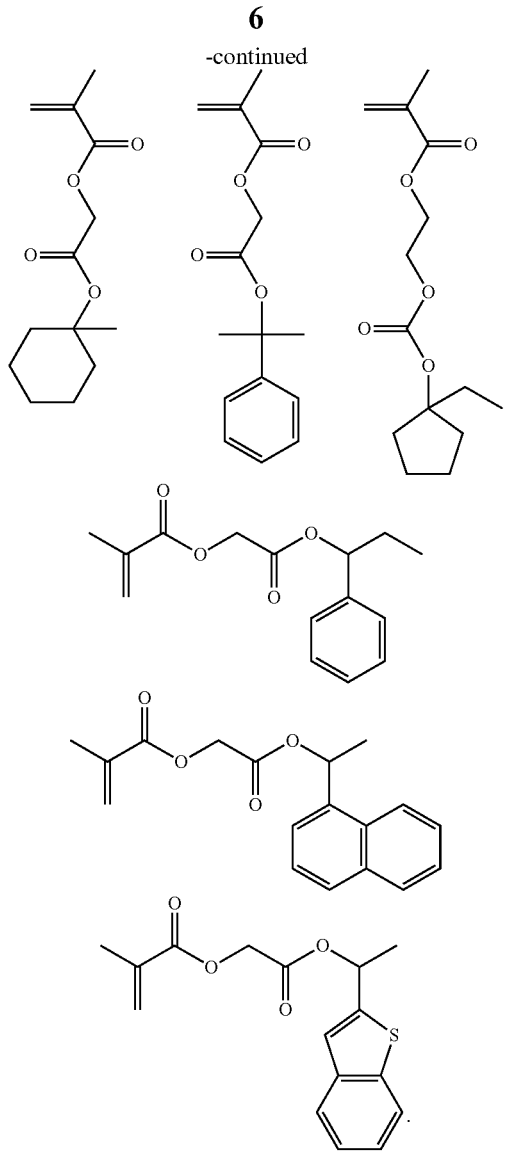

Non-limiting examples of monomers of Formula (1b) include:

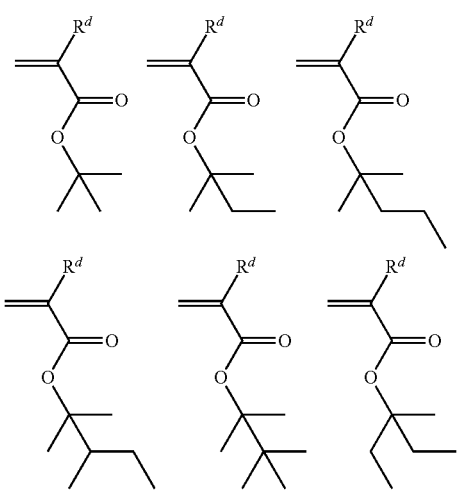

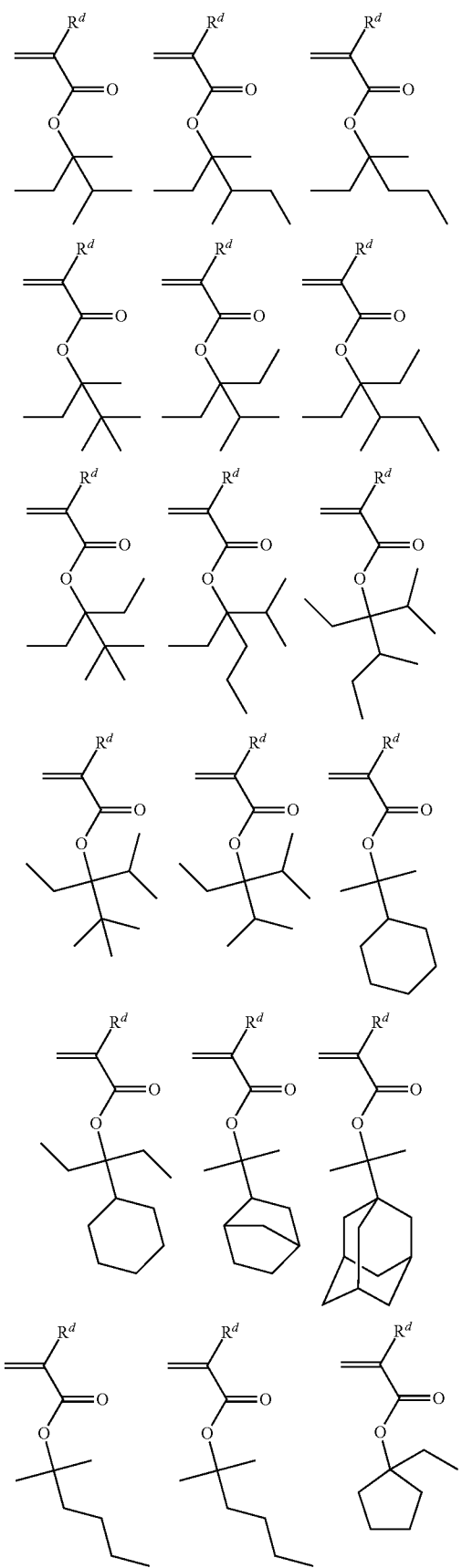
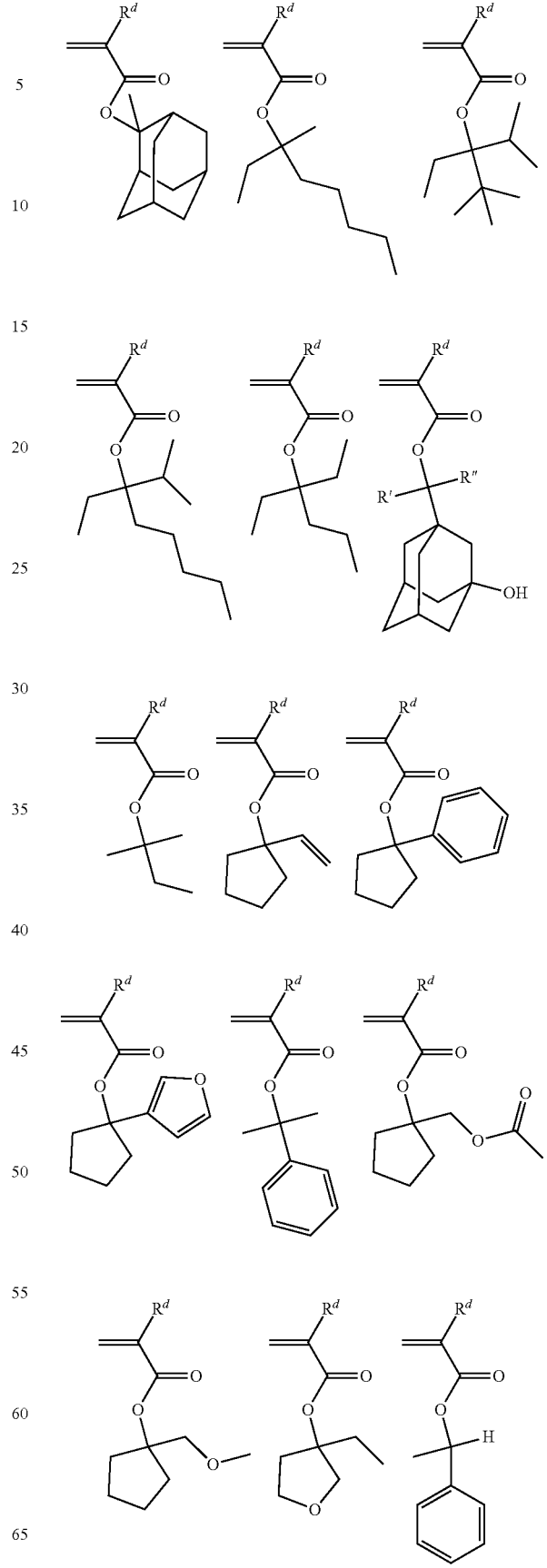

-continued

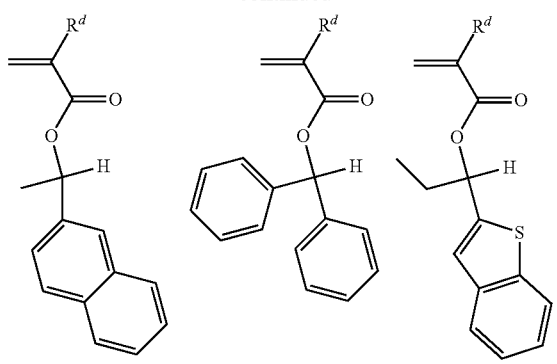

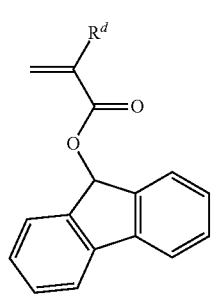

wherein $R^d$ is as defined above; and R' and R" are each independently a straight chain or branched $C_{1-20}$ alkyl, a monocyclic or polycyclic $C_{3-20}$ cycloalkyl, a monocyclic or polycyclic $C_{3-20}$ heterocycloalkyl, a straight chain or branched $C_{2-20}$ alkenyl, a monocyclic or polycyclic $C_{3-20}$ cycloalkenyl, a monocyclic or polycyclic $C_{3-20}$ heterocycloalkenyl, a monocyclic or polycyclic $C_{6-20}$ aryl, or a monocyclic or polycyclic $C_{4-20}$ heteroaryl, each of which is substituted or unsubstituted.

Non-limiting examples of monomers of Formula (1c) include:

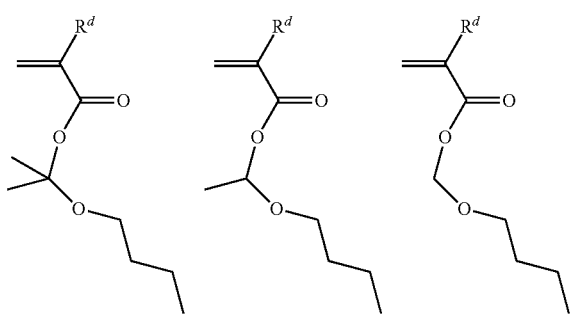

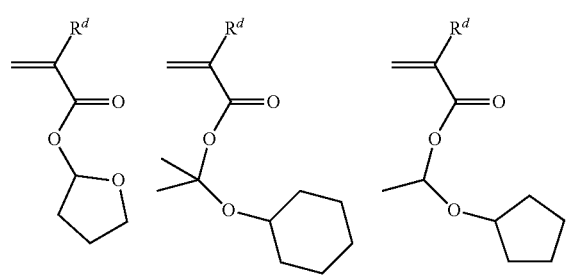

-continued

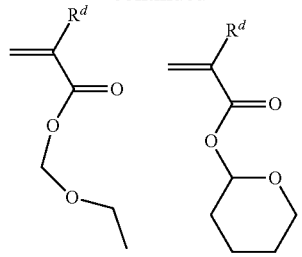

wherein $R^d$ is as defined above.

Non-limiting examples of monomers (1d) include:

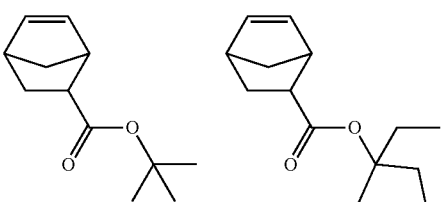

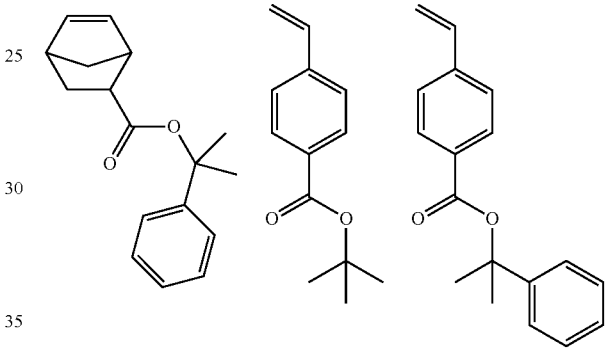

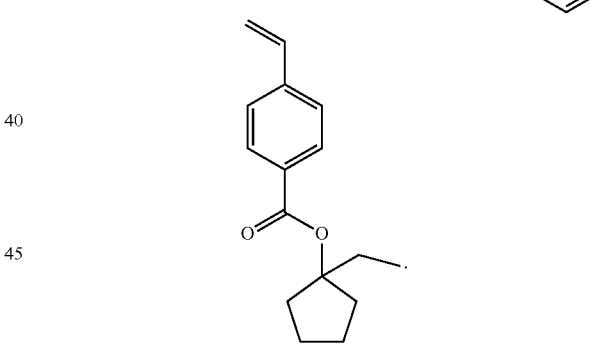

In still another example, the monomer comprising an acid-labile group may have a cyclic acetal or cyclic ketal group, for example, of the formulas:

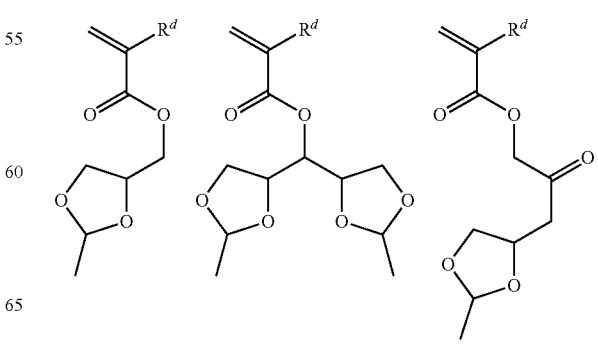

-continued
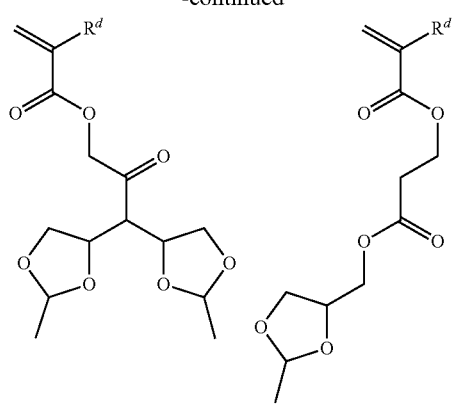
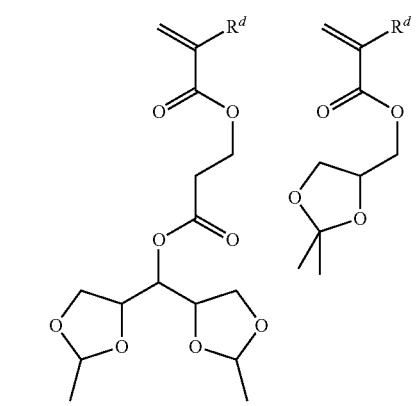
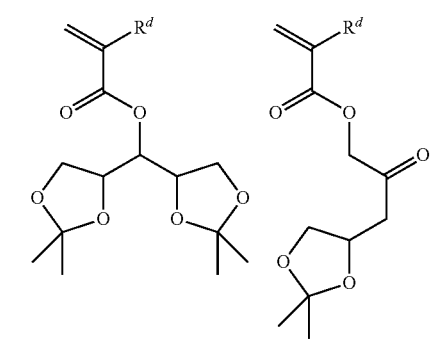
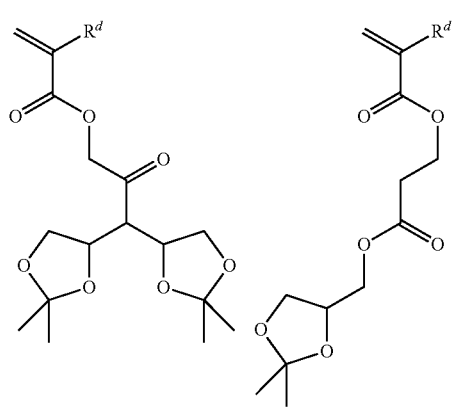
-continued
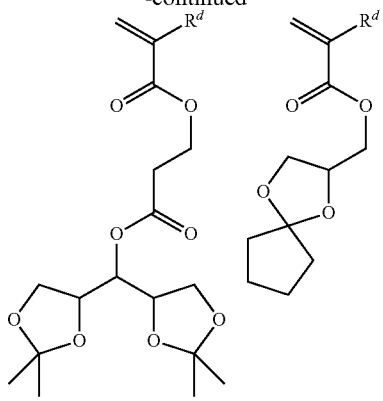
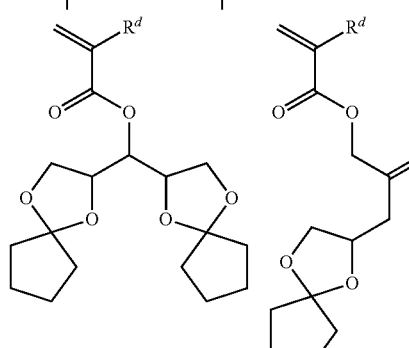
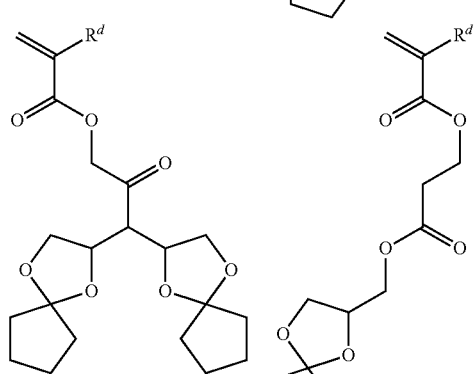
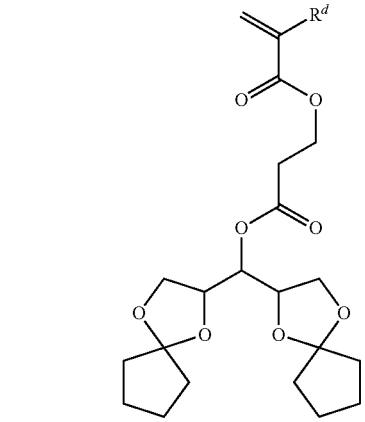
wherein $R^d$ is as defined above.
In still another example, the monomer comprising an acid-labile group may have a tertiary alkoxy group, for example, of the formulas:

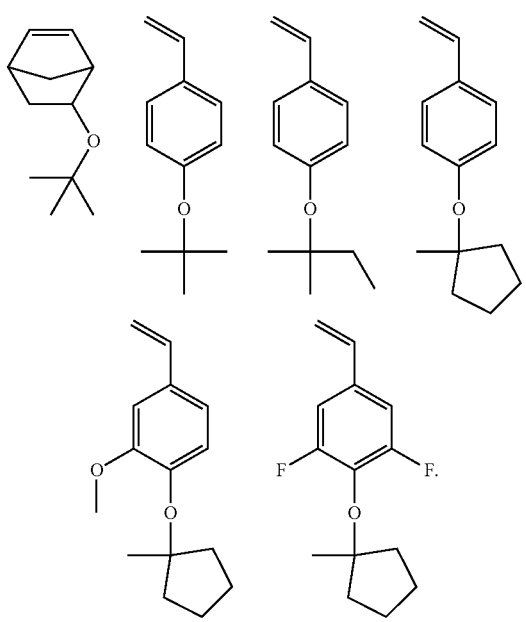

The repeating unit containing an acid labile group is typically present in the first polymer in an amount of 25 to 70 mole percent (mol %), typically 30 to 50 mol %, more typically 30 to 45 mol %, based on total repeating units in the first polymer.

In an exemplary embodiment, the first polymer is a (meth)acrylate polymer.

The first polymer typically includes one or more additional repeating units different from the first repeating unit. Suitable additional repeating units may include, for example, one or more additional units for purposes of adjusting properties of the photoresist composition, such as etch rate and solubility. Exemplary additional units may include one or more of (meth)acrylate, vinyl ether, vinyl ketone, and vinyl ester. The one or more additional repeating units if present in the first polymer may be used in an amount of up to 70 mol %, typically from 3 to 50 mol %, based on total repeating units of the first polymer. Suitable additional repeating units include, for example, one or more of a repeating unit comprising a lactone group, a repeating unit comprising a base-soluble group, a repeating unit comprising a polar group, a repeating unit as described below comprising a diamide quencher of the invention, and combinations thereof.

Suitable repeating units containing a lactone group may be derived from a monomer of formula (2):

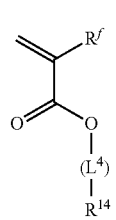

(2)

In formula (2), $R^f$ is hydrogen, fluorine, cyano, a substituted or unsubstituted $C_{1-10}$ alkyl, or a substituted or unsubstituted $C_{1-10}$ fluoroalkyl. Preferably, $R^f$ is hydrogen, fluorine, or substituted or unsubstituted $C_{1-5}$ alkyl, typically methyl. $L^4$ may be a single bond or a divalent linking group comprising one or more of substituted or unsubstituted $C_{1-30}$ alkylene, substituted or unsubstituted $C_{1-30}$ heteroalkylene, substituted or unsubstituted $C_{3-30}$ cycloalkylene, substituted or unsubstituted $C_{1-30}$ heterocycloalkylene, substituted or unsubstituted $C_{6-30}$ arylene, substituted or unsubstituted $C_{7-30}$ arylalkylene, or substituted or unsubstituted $C_{1-30}$ heteroarylene, or substituted or unsubstituted $C_{3-30}$ heteroarylalkylene, wherein $L^4$ optionally may further include one or more groups chosen, for example, from —O—, —C(O)—, —C(O)—O—, —S—, —S(O)$_2$—, and —N($R^{44}$)—S(O)$_2$—, wherein $R^{44}$ may be hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. $R^{14}$ may be a monocyclic, polycyclic, or fused polycyclic $C_{4-20}$ lactone-containing group.

Non-limiting examples of monomers containing a lactone group of formula (2) include:

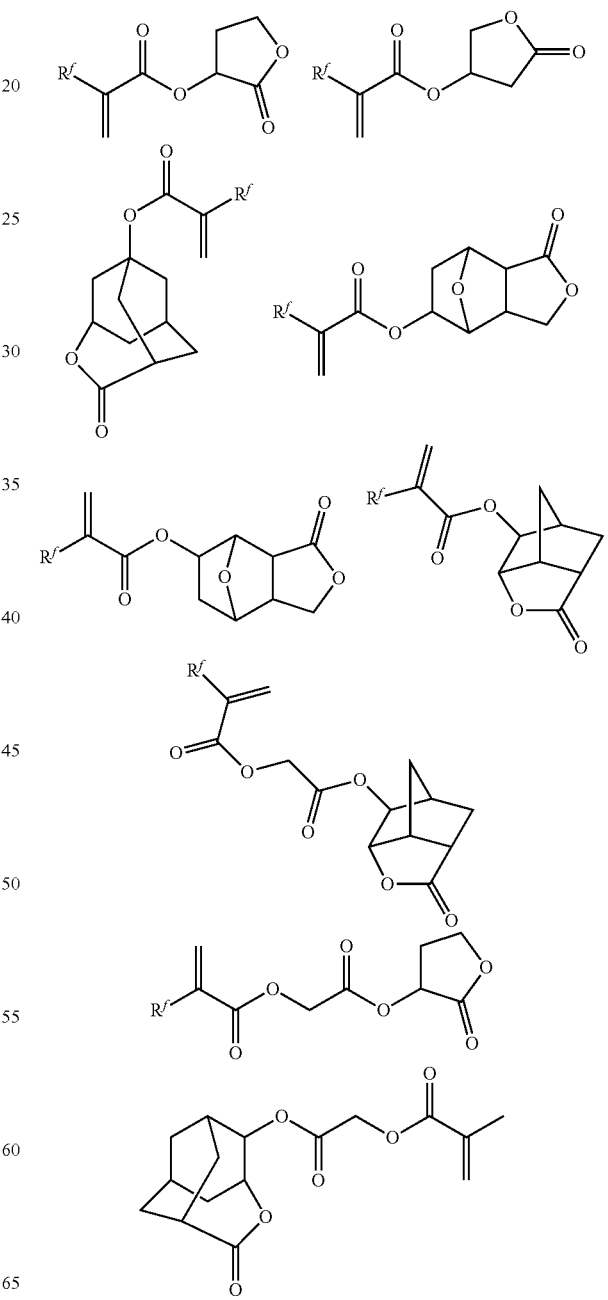

wherein $R^f$ is as disclosed herein.

For polymerized units containing a base-soluble group, the base-soluble group has a pKa of less than or equal to 12, preferably from 2 to 12, more preferably from 3 to 9, and most preferably from 4 to 8. The pKa is typically measured in an aqueous solution at 25° C. and may be determined experimentally, for example, by potentiometric titration such as by using a potentiometric pH meter available from Sirius Analytical Instruments Ltd., or may be calculated, for example, by using Advanced Chemistry Development (ACD) Labs Software Version 11.02. When an acid value of a functional group having a relatively high pKa (e.g., a —C(CF$_3$)$_2$OH group) is to be measured, a non-aqueous titrant such as an organic solvent or organic solvent mixture may be used.

Suitable repeating units containing a base-soluble group may be derived from a monomer of formula (3):

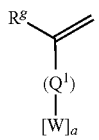

(3)

wherein the repeating unit has a pKa of less than or equal to 12. R$^g$ may be hydrogen, fluorine, cyano, a substituted or unsubstituted C$_{1-10}$ alkyl, or a substituted or unsubstituted C$_{1-10}$ fluoroalkyl. Preferably, R$^g$ is hydrogen, fluorine, or substituted or unsubstituted C$_{1-5}$ alkyl, typically methyl. Q$^1$ may be one or more of substituted or unsubstituted C$_{1-30}$ alkylene, substituted or unsubstituted C$_{3-30}$ cycloalkylene, substituted or unsubstituted C$_{1-30}$ heterocycloalkylene, substituted or unsubstituted C$_{6-30}$ arylene, substituted or unsubstituted divalent C$_{7-30}$ arylalkyl, substituted or unsubstituted C$_{1-30}$ heteroarylene, or substituted or unsubstituted divalent C$_{3-30}$ heteroarylalkyl, or —C(O)—O—. W is a base-soluble group and can be chosen, for example, from —C(O)—OH; a fluorinated alcohol such as —C(CF$_3$)$_2$OH; an amide; an imide; or —NH—S(O)$_2$—Y$^1$ where Y$^1$ is F or C$_{1-4}$ perfluoroalkyl. In formula (3), a is an integer of 1 to 3.

Non-limiting examples of monomers of formula (3) include:

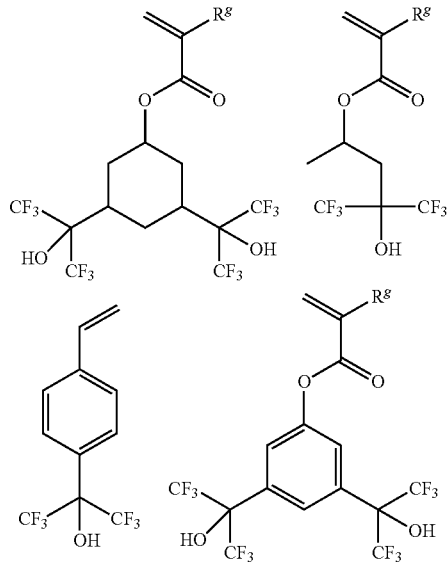

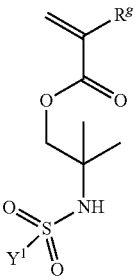

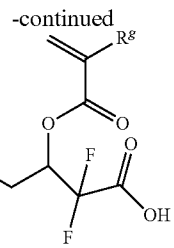

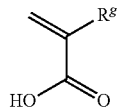

wherein R$^g$ and Y$^1$ are as described above.

Suitable repeating units containing a polar group may be derived from a monomer of formula (4):

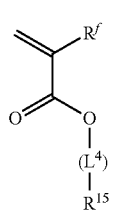

(4)

In formula (4), R$^f$ is hydrogen, fluorine, cyano, a substituted or unsubstituted C$_{1-10}$ alkyl, or a substituted or unsubstituted C$_{1-10}$ fluoroalkyl. Preferably, R$^f$ is hydrogen, fluorine, or substituted or unsubstituted C$_{1-5}$ alkyl, typically methyl. L$^4$ may be a single bond or a divalent linking group comprising one or more of substituted or unsubstituted C$_{1-30}$ alkylene, substituted or unsubstituted C$_{1-30}$ heteroalkylene, substituted or unsubstituted C$_{3-30}$ cycloalkylene, substituted or unsubstituted C$_{1-30}$ heterocycloalkylene, substituted or unsubstituted C$_{6-30}$ arylene, substituted or unsubstituted C$_{7-30}$ arylalkylene, or substituted or unsubstituted C$_{1-30}$ heteroarylene, or substituted or unsubstituted C$_{3-30}$ heteroarylalkylene, wherein L$^4$ optionally may further include one or more groups chosen, for example, from —O—, —C(O)—, —C(O)—O—, —S—, —S(O)$_2$—, and —N(R$^{44}$)—S(O)$_2$—, wherein R$^{44}$ may be hydrogen, a straight chain or branched $C_{1-20}$ alkyl, monocyclic or polycyclic $C_{3-20}$ cycloalkyl, or monocyclic or polycyclic $C_{3-20}$ heterocycloalkyl. $R^{15}$ may be a polar group, for example, hydroxyalkyl such has a $C_1$-$C_{15}$ alkyl group substituted with one or more hydroxy groups or cyano groups.

Non-limiting examples of monomers of formula (4) include:

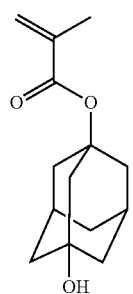
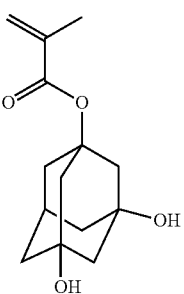
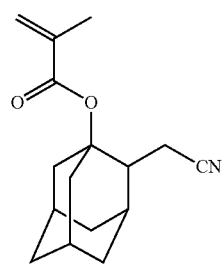
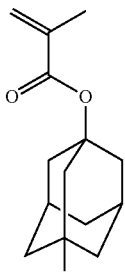
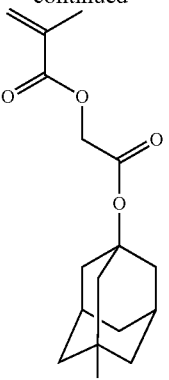
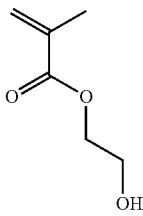

Exemplary copolymers that may be used as the first polymer include, for example, the following:

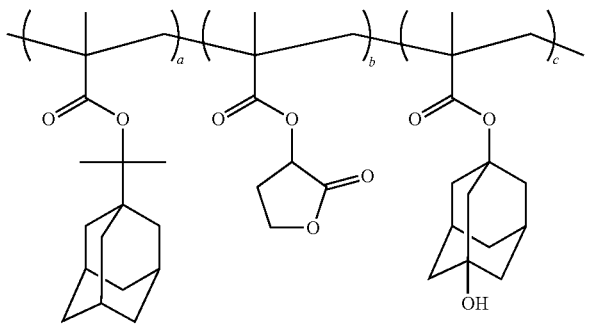
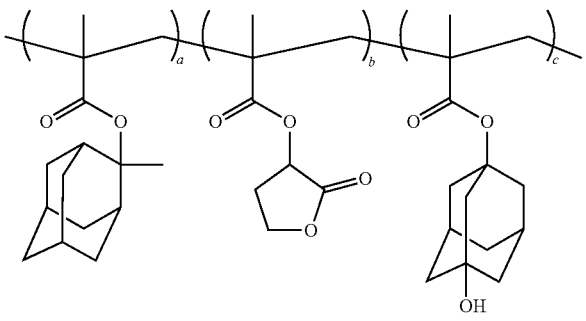
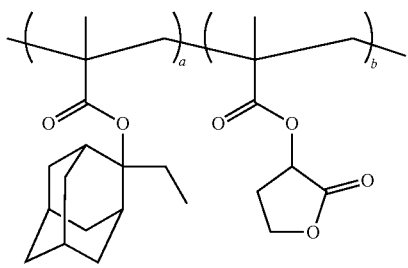
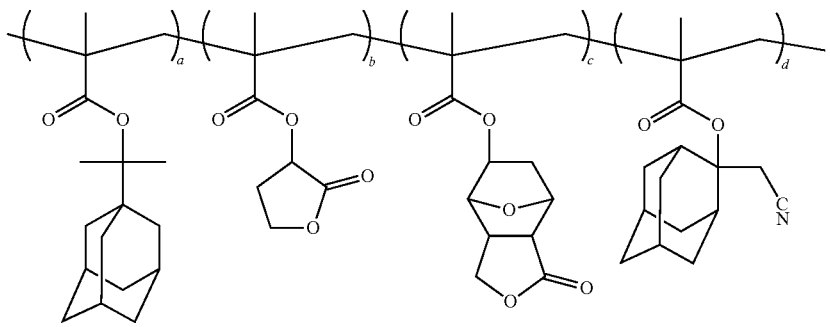

19 20
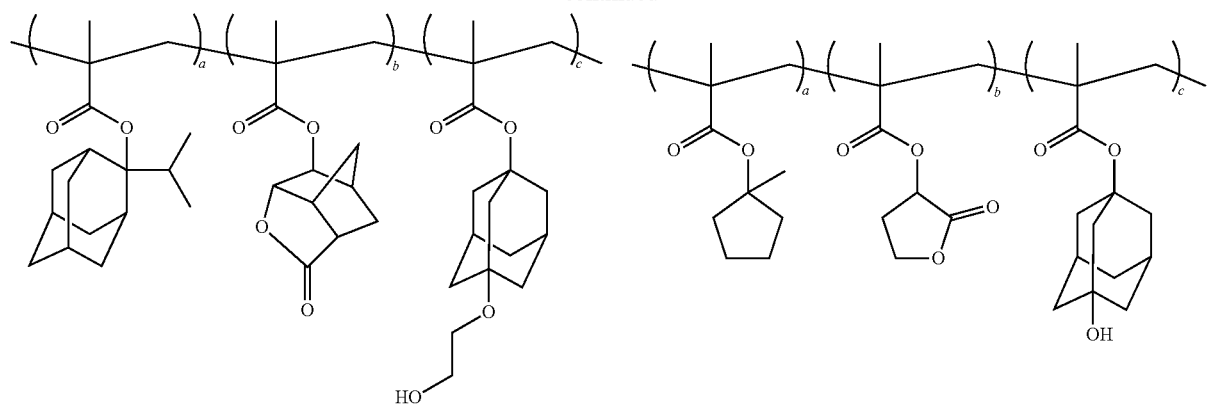
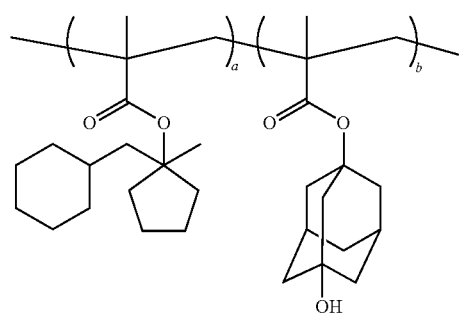
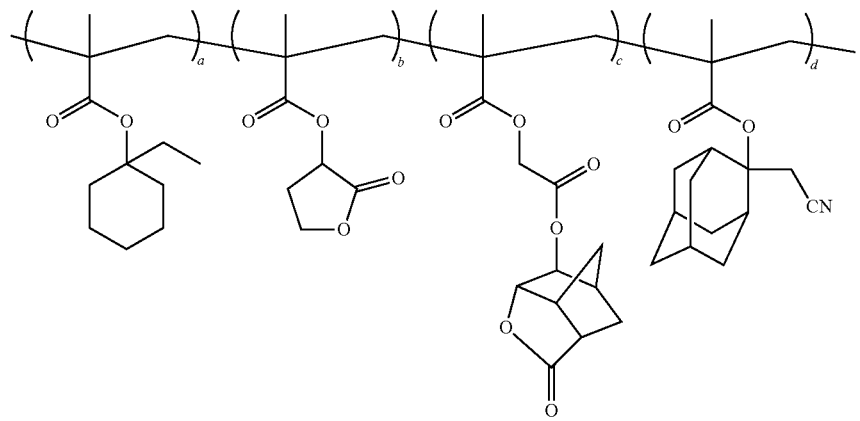
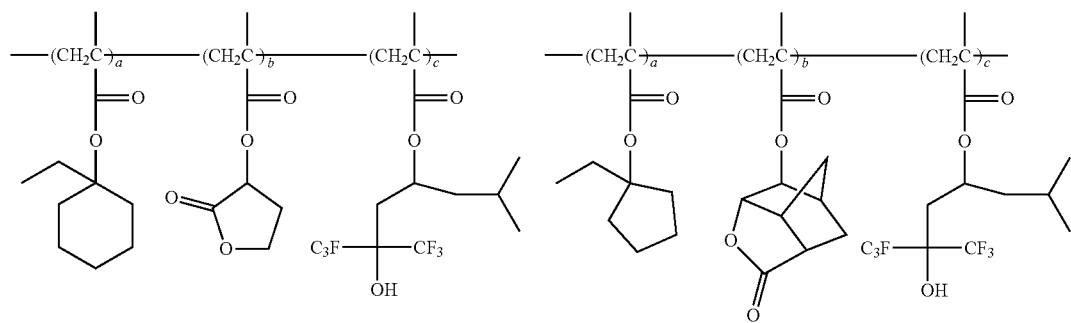

-continued
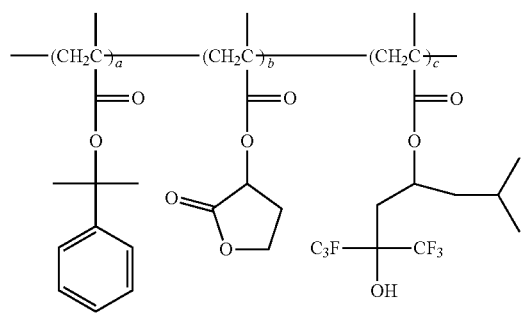
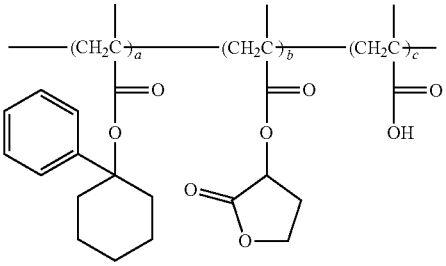
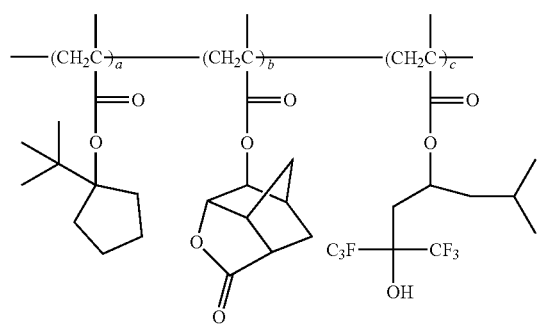
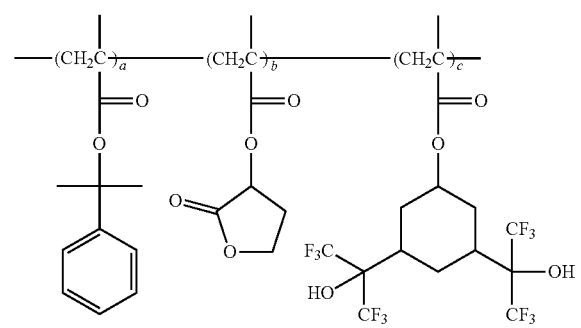
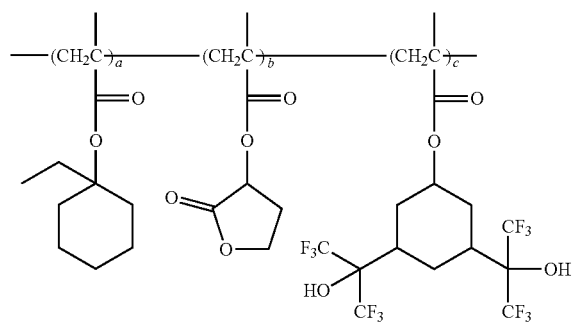
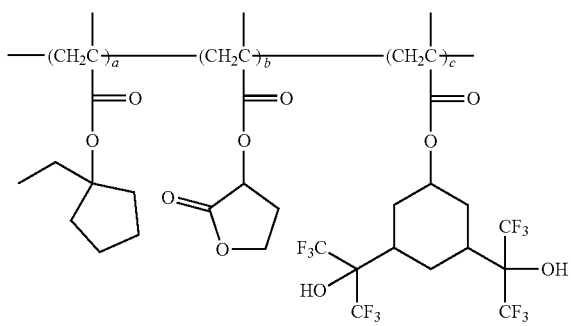
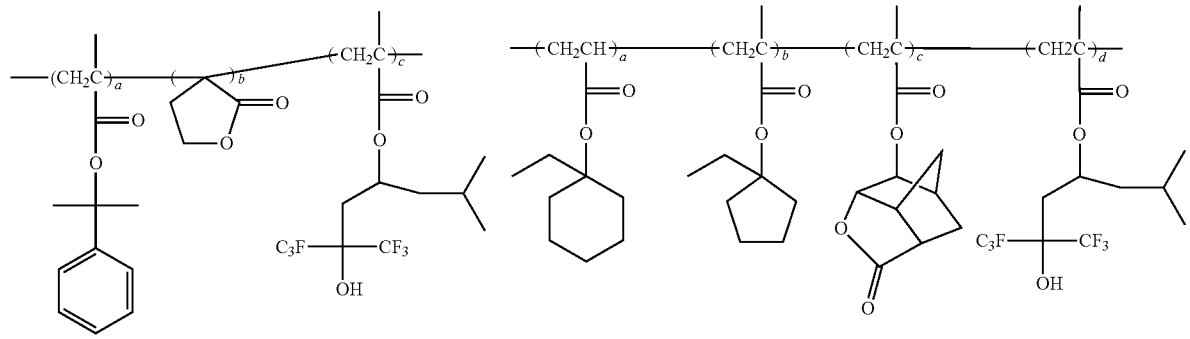
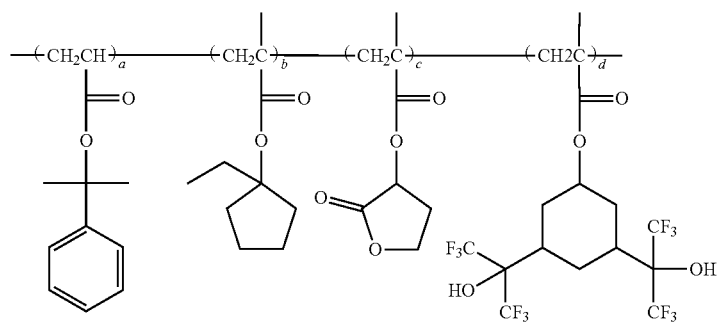

-continued

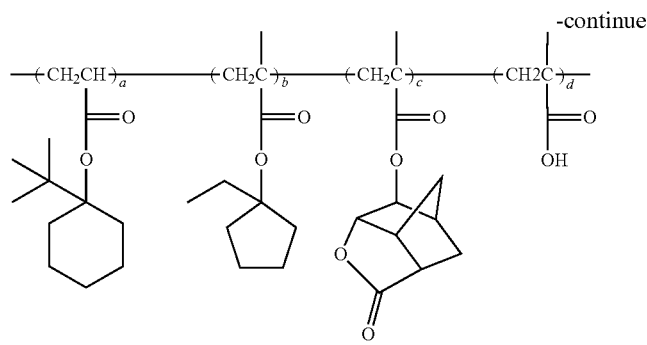

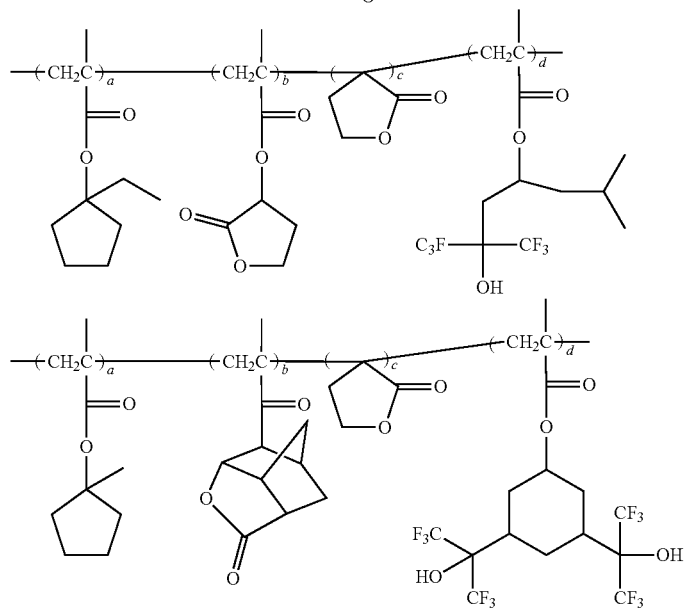

The first polymer typically has a weight average molecular weight MW of 1,000 to 50,000 Daltons (Da), specifically 2,000 to 30,000 Da, more specifically 3,000 to 20,000 Da, still more specifically 3,000 to 10,000 Da. Molecular weights are determined by GPC using polystyrene standards. The first polymer is typically present in the photoresist composition in an amount of from 50 to 97 weight percent (wt %), preferably from 75 to 95 wt % and more preferably 80 to 90 wt %, based on total solids of the photoresist composition.

The first polymer is preferably prepared by free radical polymerization using techniques well known to those skilled in the art.

For example, one or more monomers corresponding to the repeating units described herein may be combined, or fed separately, using suitable solvent(s) and initiator, and polymerized in a reactor. For example, the first and second polymers may be obtained by polymerization of the respective monomers under any suitable conditions, such as by heating at an effective temperature, irradiation with actinic radiation at an effective wavelength, or a combination thereof. Typically, upon mixing and once a desirable molecular weight has been reached, the reaction mixture is allowed to cool down, and then poured into a non-solvent. The polymer precipitates out of the non-solvent and can be collected by filtration, isolated and dried. The reaction mixture can also be simply concentrated by removing reaction solvent.

The photoresist compositions may further include one or more polymers in addition to and different from the first polymer described above. For example, the photoresist compositions may include an additional polymer as described above but different in composition, or a polymer that is similar to those described above but does not include each of the requisite repeating units. Additionally, or alternatively, the one or more additional polymers may include those well known in the photoresist art, for example, those chosen from polyacrylates, polyvinylethers, polyesters, polynorbornenes, polyacetals, polyethylene glycols, polyamides, polyacrylamides, polyphenols, novolacs, styrenic polymers, polyvinyl alcohols, or combinations thereof.

The photoresist compositions further include one or more photoacid generators (PAGs). Suitable photoacid generator compounds may have formula $G^+A^-$, wherein $G^+$ is an organic cation and $A^-$ is an organic anion typically comprising a sulfonate, an anion of a sulfonamide, an anion of a sulfonimide, or a methide anion. Suitable organic anions include, for example, fluoroalkyl and alkylsulfonate, fluorocycloalkyl and cycloalkylsulfonate.

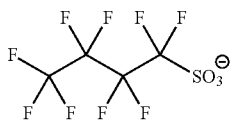

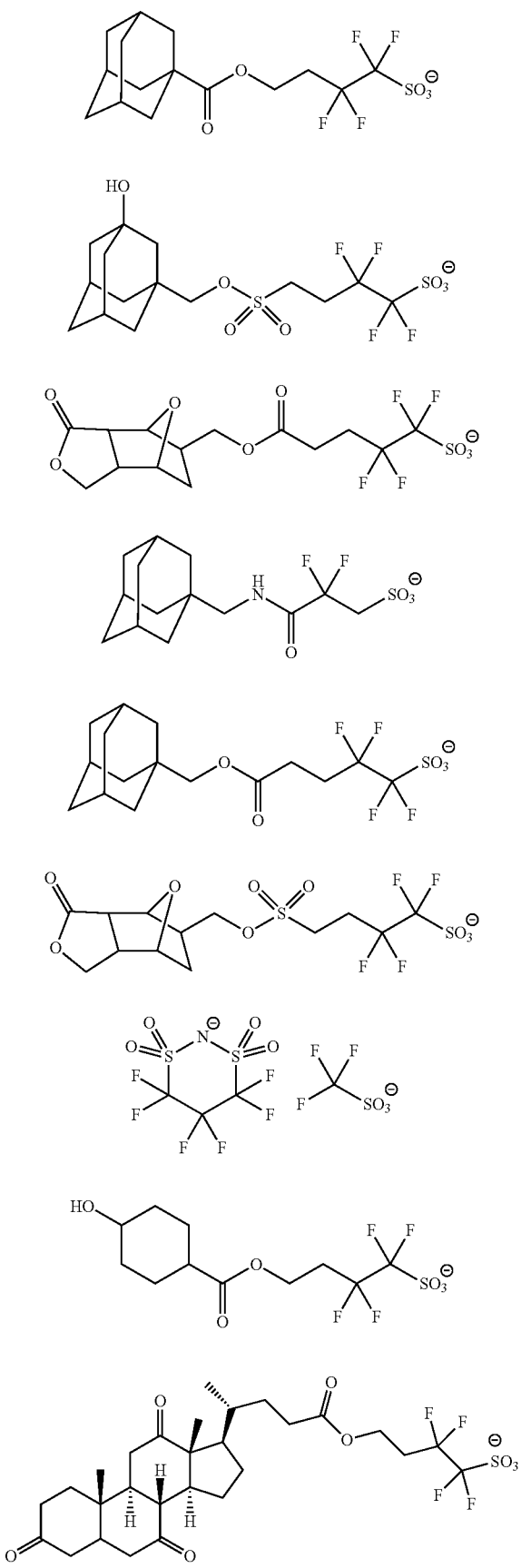

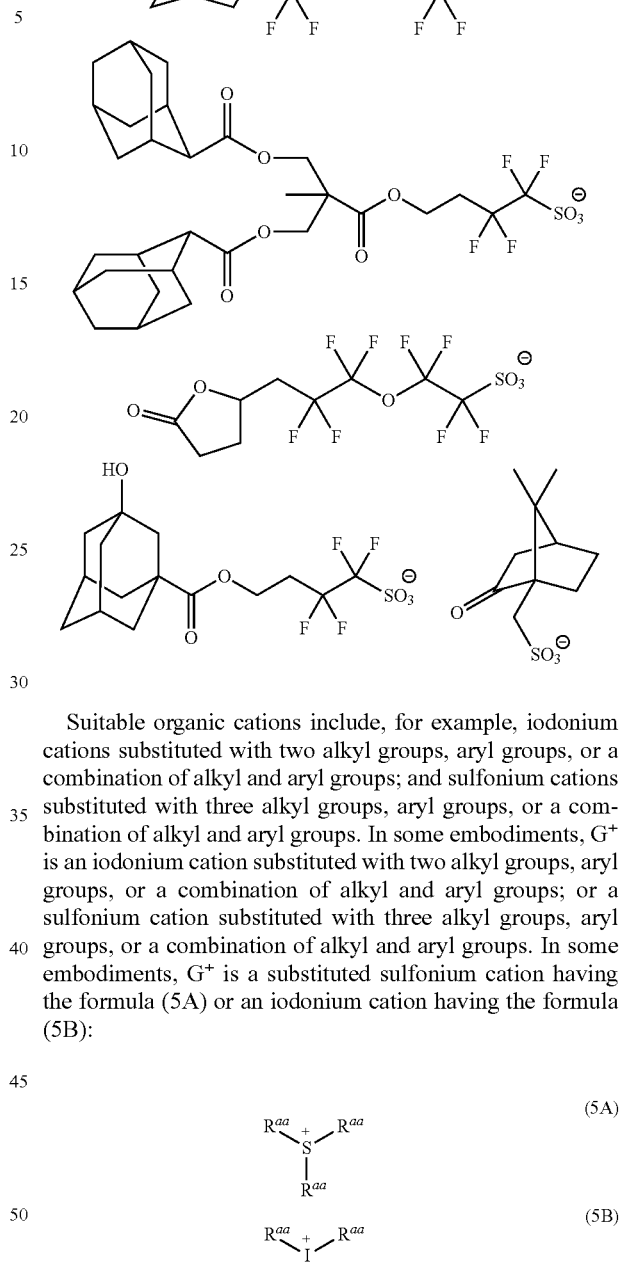

Suitable organic cations include, for example, iodonium cations substituted with two alkyl groups, aryl groups, or a combination of alkyl and aryl groups; and sulfonium cations substituted with three alkyl groups, aryl groups, or a combination of alkyl and aryl groups. In some embodiments, $G^+$ is an iodonium cation substituted with two alkyl groups, aryl groups, or a combination of alkyl and aryl groups; or a sulfonium cation substituted with three alkyl groups, aryl groups, or a combination of alkyl and aryl groups. In some embodiments, $G^+$ is a substituted sulfonium cation having the formula (5A) or an iodonium cation having the formula (5B):

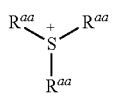

(5A)

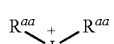

(5B)

wherein, each $R^{aa}$ is independently a $C_{1-20}$ alkyl group, a $C_{1-20}$ fluoroalkyl group, a $C_{3-20}$ cycloalkyl group, a $C_{3-20}$ fluorocycloalkyl group, a $C_{2-20}$ alkenyl group, a $C_{2-20}$ fluoroalkenyl group, a $C_{6-30}$ aryl group, a $C_{6-30}$ fluoroaryl group, $C_{6-30}$ iodoaryl group, a $C_{1-30}$ heteroaryl group, a $C_{7-20}$ arylalkyl group, a $C_{7-20}$ fluoroarylalkyl group, a $C_{2-20}$ heteroarylalkyl group, or a $C_{2-20}$ fluoroheteroarylalkyl group, each of which is substituted or unsubstituted, wherein each $R^{aa}$ is either separate or connected to another group $R^{aa}$ via a single bond or a divalent linking group to form a ring. Each $R^{aa}$ optionally may include as part of its structure one or more groups selected from —O—, —C(O)—, —C(O)—O—, —$C_{1-12}$ hydrocarbylene-, —O—($C_{1-12}$ hydrocarbylene)-, —C(O)—O—($C_{1-12}$ hydrocarbylene)-, and —C(O)—O—(C$_{1-12}$ hydrocarbylene)-O—. Each R$^{aa}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Suitable divalent linking groups for connection of R$^{aa}$ groups include, for example, —O—, —S—, —Te—, —Se—, —C(O)—, —C(S)—, —C(Te)—, or —C(Se)—, substituted or unsubstituted C$_{1-5}$ alkylene, and combinations thereof.

Exemplary sulfonium cations of formula (5A) include the following:

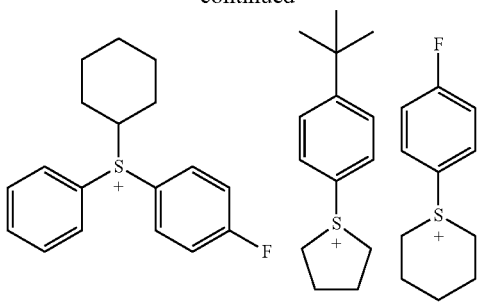

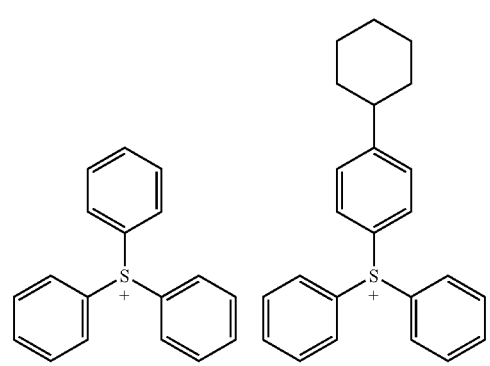

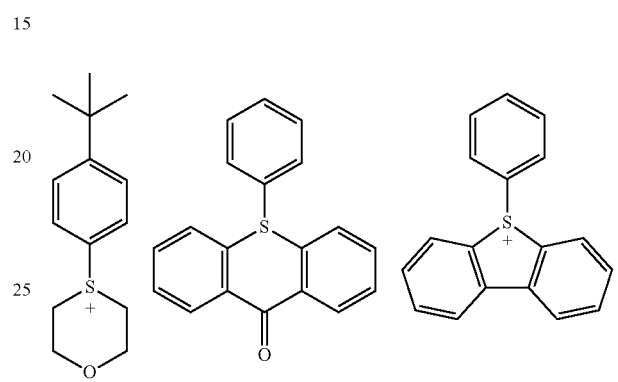

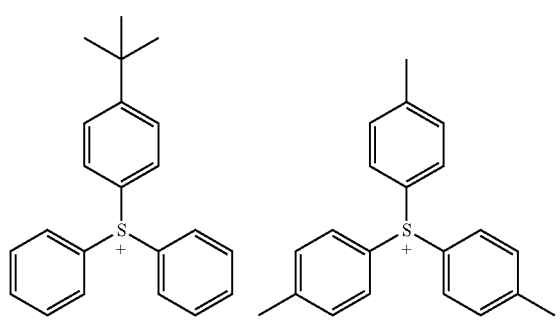

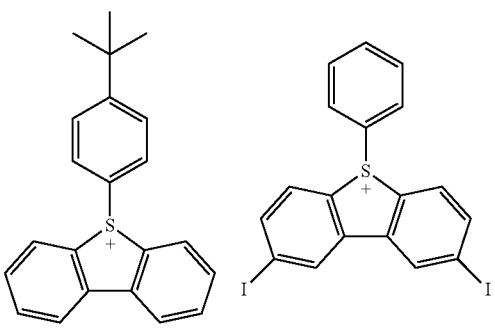

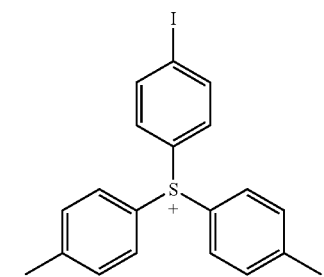

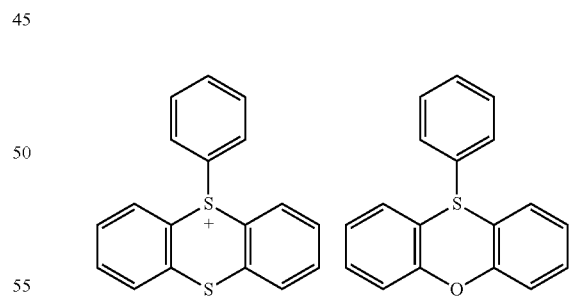

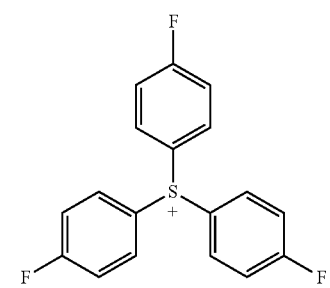

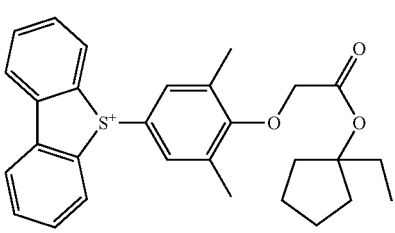

29
-continued
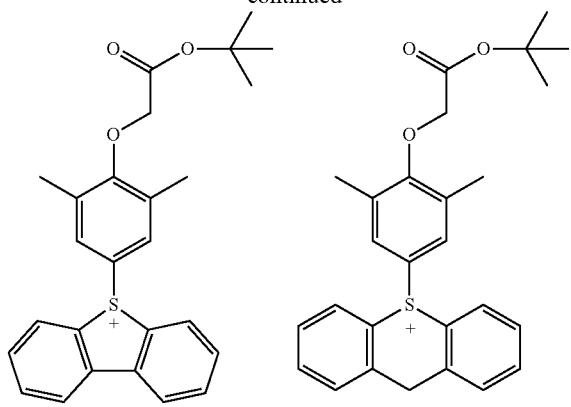
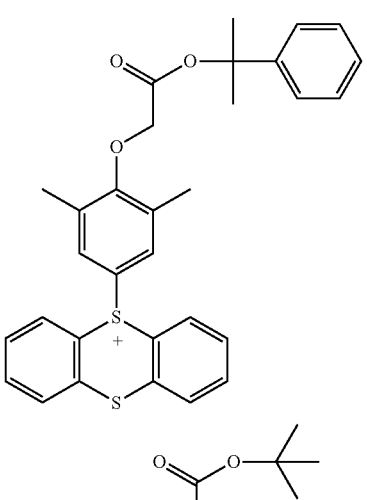
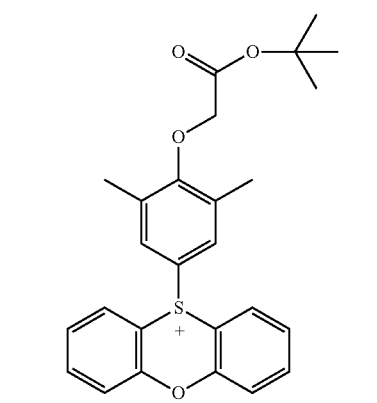
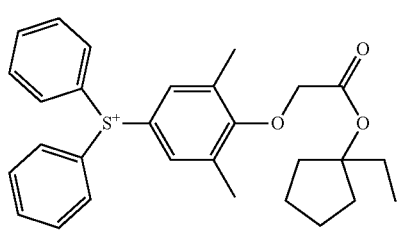
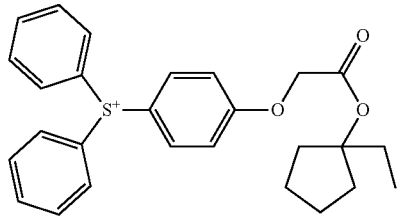
30
-continued
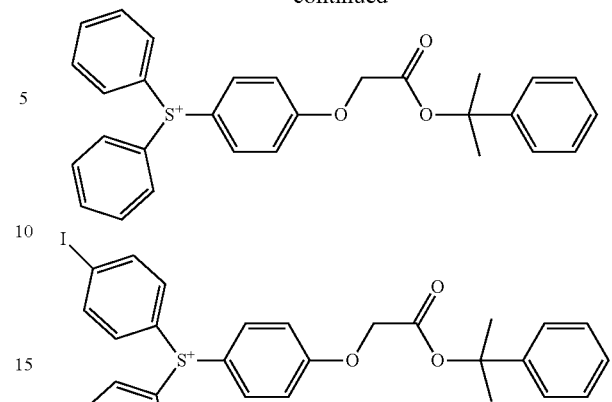
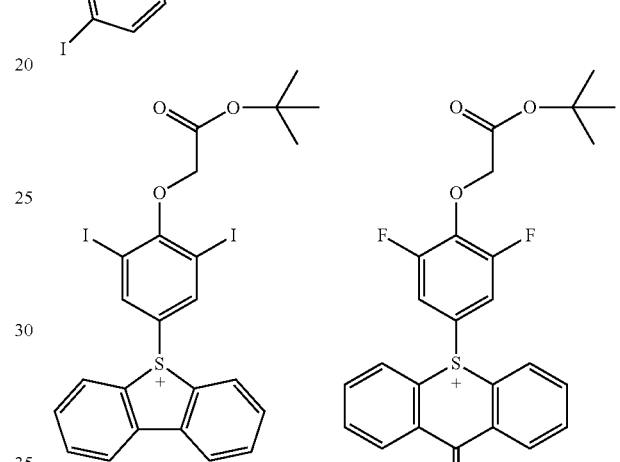
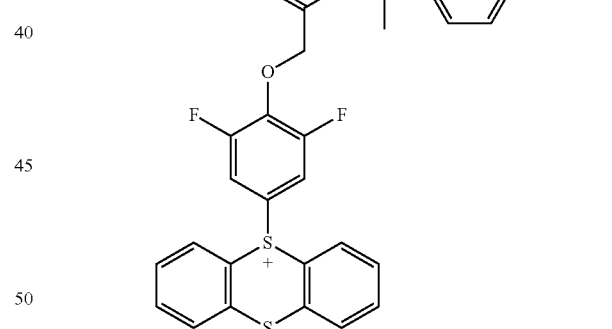
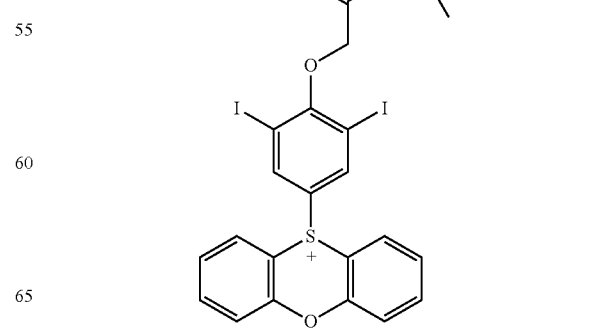

-continued

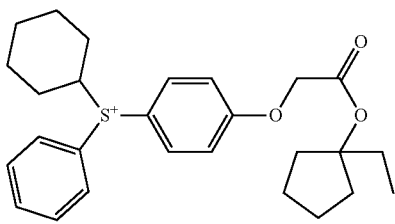

Exemplary iodonium cations of formula (5B) include the following:

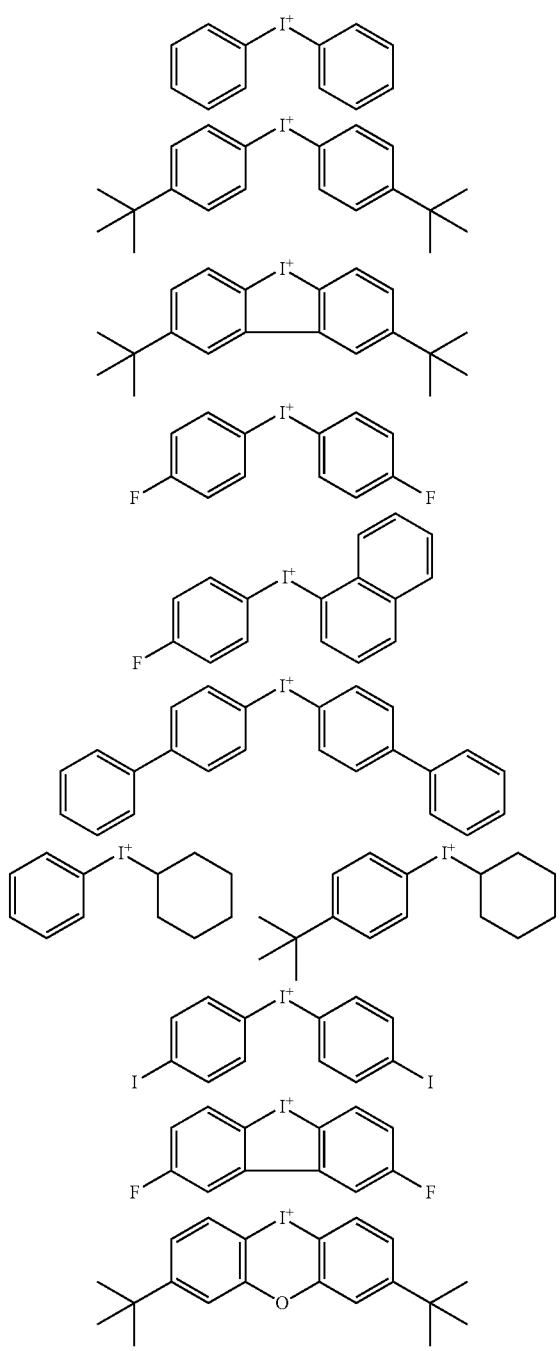

-continued

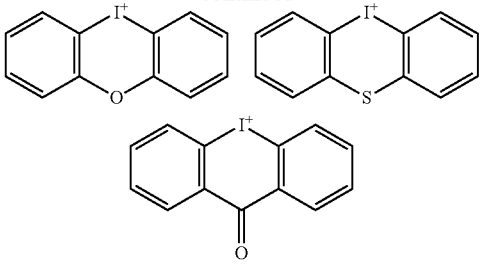

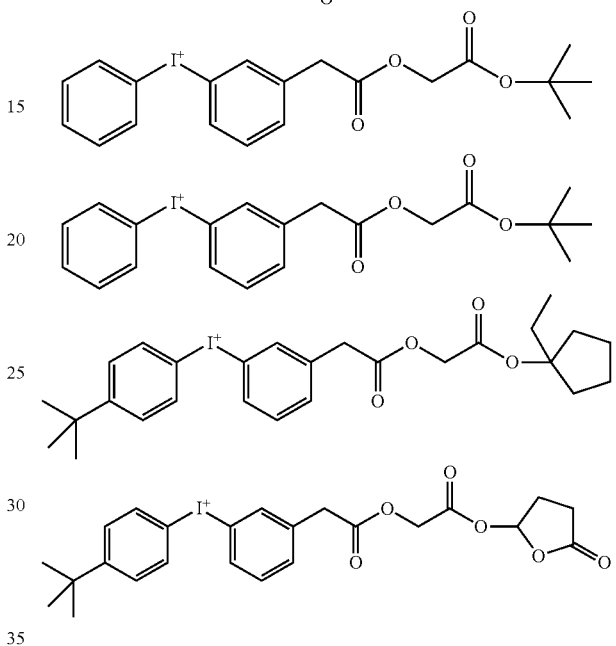

The PAG may be present in the photoresist compositions in non-polymeric form or in polymerized form, for example, as part of the first polymer or a different polymer. Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, triphenylsulfonium (adamantan-1-ylmethoxycarbonyl)-difluoromethanesulfonate and triphenylsulfonium camphorsulfonate; di-t-butyphenyliodonium perfluorobutanesulfonate, and di-t-butyphenyliodonium camphorsulfonate. Non-ionic sulfonates and sulfonyl compounds are also known to function as photoacid generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, triphenylsulfonium (adamantan-1-ylmethoxycarbonyl)-difluoromethanesulfonate, triphenylsulfonium camphorsulfonate and 2-(4-methoxynaphthyl)-4,6-bis(trichloromethyl)-1,3,5-triazine. Suitable photoacid generators are further described in U.S. Pat. No. 8,431,325 to Hashimoto et al. in column 37, lines 11-47 and columns 41-91. Other suitable sulfonate PAGS include sulfonated esters and sulfonyloxy ketones, nitrobenzyl esters, s-triazine derivatives, benzoin tosylate, t-butylphenyl α-(p-toluenesulfonyloxy)-acetate, and t-butyl α-(p-toluenesulfonyloxy)-acetate; as described in U.S. Pat. Nos. 4,189,323 and 8,431,325. Typically, the photoacid generator is present in the photoresist composition in an amount of from 2 to 65 wt %, more typically 5 to 55 wt %, and more preferably 8 to 25 wt %, based on total solids of the photoresist composition.

The photoresist compositions further contain a quencher having the structure of formula (6):

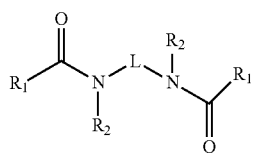

(6)

wherein $R_1$ is independently a hydrogen atom, $C_1$-$C_{20}$ linear, $C_3$-$C_{20}$ branched, or $C_3$-$C_{20}$ cyclic alkyl, the alkyl optionally comprises an —O— group other than at an alpha-position with respect to the amide C(O), or $C_6$-$C_{20}$ aryl; $R_2$ is independently a hydrogen atom, $C_1$-$C_{20}$ linear, $C_3$-$C_{20}$ branched, or $C_3$-$C_{20}$ cyclic alkyl, or $C_6$-$C_{20}$ aryl; L is $C_1$-$C_{20}$ linear or $C_3$-$C_{20}$ branched alkylene comprising one or more heteroatom-containing groups independently selected from —O—, —S—, or —N($R_3$)—, wherein $R_3$ is selected from a hydrogen atom or $C_1$-$C_{20}$ linear or $C_3$-$C_{20}$ branched or cyclic alkyl; and wherein each of $R_1$, $R_2$, and L may independently be substituted or unsubstituted. Suitable substituents for $R_1$, $R_2$, and L include, for example, cyano, $C_{1-6}$ cyanoalkyl, $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{4-12}$ heterocycloalkyl, $C_{3-12}$ heteroaryl, $C_{1-6}$ alkyl sulfonyl (—S(=O)$_2$-alkyl), $C_{6-12}$ arylsulfonyl (—S(=O)$_2$-aryl), tosyl (CH$_3$C$_6$H$_4$SO$_2$—), or combinations thereof. When a group is substituted, the indicated number of carbon atoms is the total number of carbon atoms in the group, excluding those of any substituents. For example, the group —CH$_2$CH$_2$CN is a $C_2$ alkyl group substituted with a cyano group.

The quencher is free of crosslinkable groups, for example, hydroxy, epoxy, carbamate and vinyl groups. As such, none of $R_1$, $R_2$ or L, whether substituted or unsubstituted, include a crosslinkable group. It is believed that the presence of such groups on the quencher would result in reaction with —COOH or —OH groups on the first polymer that may be formed during exposure and post-exposure bake after cleavage of acid labile groups on the polymer. This would result in reduced polarity switching of the polymer in exposed regions of the photoresist layer, causing a reduction in contrast between exposed and unexposed regions of the photoresist layer.

The quencher is present in the photoresist compositions for control of photo-generated acid diffusion in photoresist layers formed from the compositions during the resist patterning process. It is believed that the presence of the two amide groups and heteroatom-containing linker in the quenchers of the invention can effectively quench (neutralize) photo-generated acid that would otherwise diffuse from exposed to unexposed resist layer regions, allowing for desired properties, for example, increased depth-of-focus and reduced roughness.

As described above, the quenchers may be in non-polymeric form. Suitable quenchers of the invention are commercially available and/or can be made by those of ordinary skill in the art. Non-polymeric quenchers are typically present in the photoresist compositions in an amount of from 0.01 to 5 wt %, preferably from 0.02 to 3 wt %, based on total solids of the photoresist composition. Exemplary suitable non-polymeric quenchers of the formula (6) are shown below:

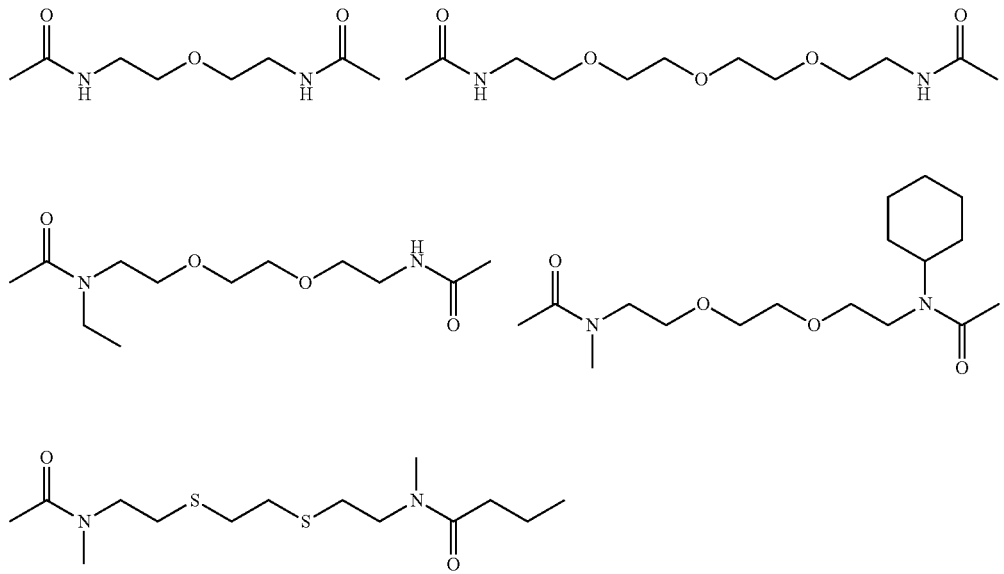

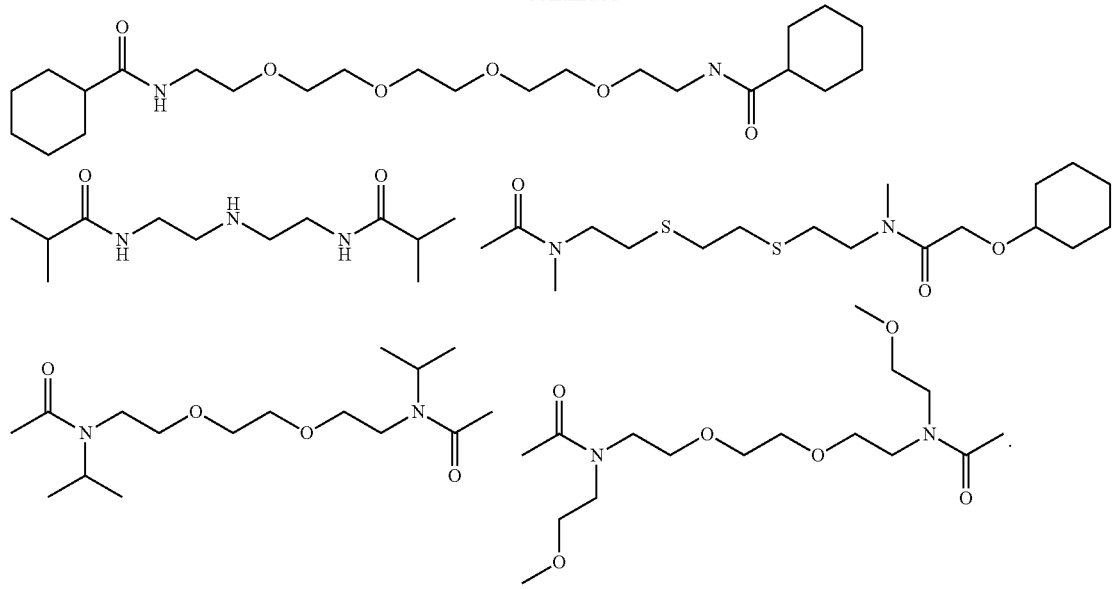

The photoresist composition may further include a material that comprises one or more base-labile groups (a "base-labile material"). As referred to herein, base-labile groups are functional groups that can undergo cleavage reaction to provide polar groups such as hydroxyl, carboxylic acid, sulfonic acid, and the like, in the presence of an aqueous alkaline developer after exposure and post-exposure baking steps. The base-labile group will not react significantly (e.g., will not undergo a bond-breaking reaction) prior to a development step of the photoresist composition that comprises the base-labile group. Thus, for instance, a base-labile group will be substantially inert during pre-exposure soft-bake, exposure, and post-exposure bake steps. By "substantially inert" it is meant that 5%, preferably <1%, of the base-labile groups (or moieties) will decompose, cleave, or react during the pre-exposure soft-bake, exposure, and post-exposure bake steps. The base-labile group is reactive under typical photoresist development conditions using, for example, an aqueous alkaline photoresist developer such as a 0.26 normal (N) aqueous solution of tetramethylammonium hydroxide (TMAH). For example, a 0.26 N aqueous solution of TMAH may be used for single puddle development or dynamic development, e.g., where the 0.26 N TMAH developer is dispensed onto an imaged photoresist layer for a suitable time such as 10 to 120 seconds (s). An exemplary base-labile group is an ester group, typically a fluorinated ester group. Preferably, the base-labile material is substantially not miscible with and has a lower surface energy than the first and second polymers, and other solid components of the photoresist composition. When coated on a substrate, the base-labile material can thereby segregate from other solid components of the photoresist composition to a top surface of the formed photoresist layer. The base-labile polymer, if used, is typically present in an amount of from 0.01 to 10 wt %, based on total solids of the photoresist composition.

In some aspects, the base-labile material is a polymeric material, also referred to herein as a base-labile polymer, that may include one or more repeating units comprising one or more base-labile groups. For example, the base-labile polymer may comprise a repeating unit comprising two or more base-labile groups that are the same or different. A preferred base-labile polymer comprises at least one repeating unit comprising 2 or more base-labile groups, for example a repeating unit comprising 2 or 3 base-labile groups.

The base-labile polymer may be a polymer comprising a repeating unit derived from a monomer of formula (7)

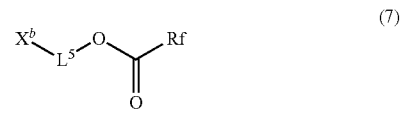

wherein $X^b$ is a polymerizable group selected from vinyl and acrylic, $L^5$ is a divalent linking group comprising one or more of substituted or unsubstituted linear or branched $C_{1-20}$ alkylene, substituted or unsubstituted $C_{3-20}$ cycloalkylene, —C(O)—, or —C(O)O—; and $R^f$ is a substituted or unsubstituted $C_{1-20}$ fluoroalkyl group provided that the carbon atom bonded to the carbonyl (C=O) in formula (7) is substituted with at least one fluorine atom.

Exemplary monomers of formula (7) include the following:

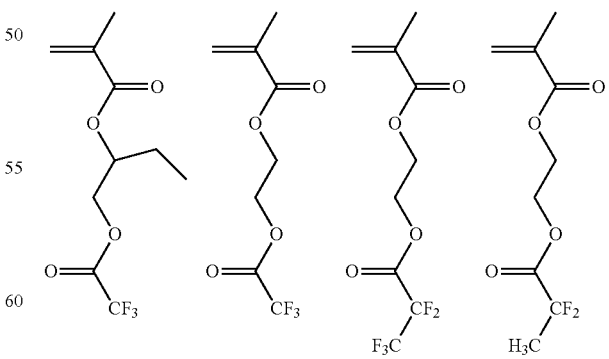

The base-labile polymer may include a repeating unit including two or more base-labile groups. For example, the base-labile polymer can include a repeating unit derived from a monomer of formula (8)

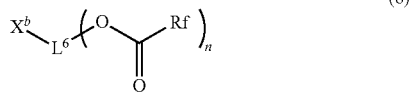

(8)

wherein $X^b$ and Rf are as defined in formula (7); $L^6$ is a polyvalent linking group comprising one or more of substituted or unsubstituted straight chain or branched $C_{1-20}$ alkylene, substituted or unsubstituted $C_{3-20}$ cycloalkylene, —C(O)—, or —C(O)O—; and n is an integer of 2 or more, for example 2 or 3.

Exemplary monomers of formula (8) include the following:

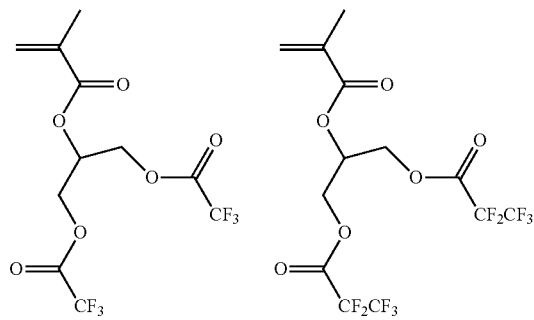

The base-labile polymer may include a repeating unit including one or more base-labile groups. For example, the base-labile polymer can include a repeating unit derived from a monomer of formula (9):

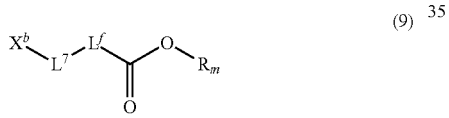

(9)

wherein $X^b$ is as defined in formula (7); $L^7$ is a divalent linking group comprising one or more of substituted or unsubstituted straight chain or branched $C_{1-20}$ alkylene, substituted or unsubstituted $C_{3-20}$ cycloalkylene, —C(O)—, or —C(O)O—; Lf is a substituted or unsubstituted $C_{1-20}$ fluoroalkylene group wherein the carbon atom bonded to the carbonyl (C=O) in formula (7) is substituted with at least one fluorine atom; and $R_m$ is substituted or unsubstituted straight chain or branched $C_{1-20}$ alkyl, or substituted or unsubstituted $C_{3-20}$ cycloalkyl.

Exemplary monomers of formula (9) include the following:

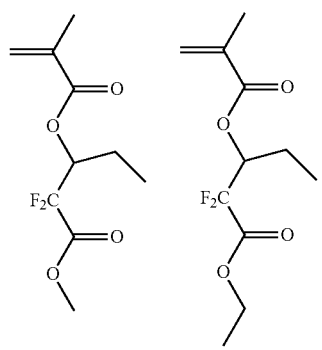 [SMILES: C=C(C)C(=O)OC(CC)C(F)(F)C(=O)OC ; C=C(C)C(=O)OC(CC)C(F)(F)C(=O)OCC]

In a further preferred aspect of the invention, a base-labile polymer may comprise one or more base-labile groups and one or more acid-labile groups, such as one or more acid-labile ester moieties (e.g. t-butyl ester) or acid-labile acetal groups. For example, the base-labile polymer may comprise a repeating unit including a base-labile group and an acid-labile group, i.e., wherein both a base-labile group and an acid-labile group are present on the same repeating unit. In another example, the base-labile polymer may comprise a first repeating unit comprising a base-labile group and a second repeating unit comprising an acid-labile group. Preferred photoresists of the invention can exhibit reduced defects associated with a resist relief image formed from the photoresist composition.

The base-labile polymer may be prepared using any suitable methods in the art, including those described herein for the first and second polymers. For example, the base-labile polymer may be obtained by polymerization of the respective monomers under any suitable conditions, such as by heating at an effective temperature, irradiation with actinic radiation at an effective wavelength, or a combination thereof. Additionally, or alternatively, one or more base-labile groups may be grafted onto the backbone of a polymer using suitable methods. The base-labile polymer typically has a weight average molecular weight MW of 1,000 to 50,000 Da, specifically 2,000 to 30,000 Da, more specifically 3,000 to 20,000 Da, still more specifically 3,000 to 10,000 Da. Molecular weights are determined by GPC using polystyrene standards. In some aspects, the base-labile material is a single molecule comprising one more base-labile ester groups, preferably one or more fluorinated ester groups. The base-labile materials that are single molecules may have a Mw in the range of 50 to 1,500 Da. Exemplary single molecule base-labile materials include the following:

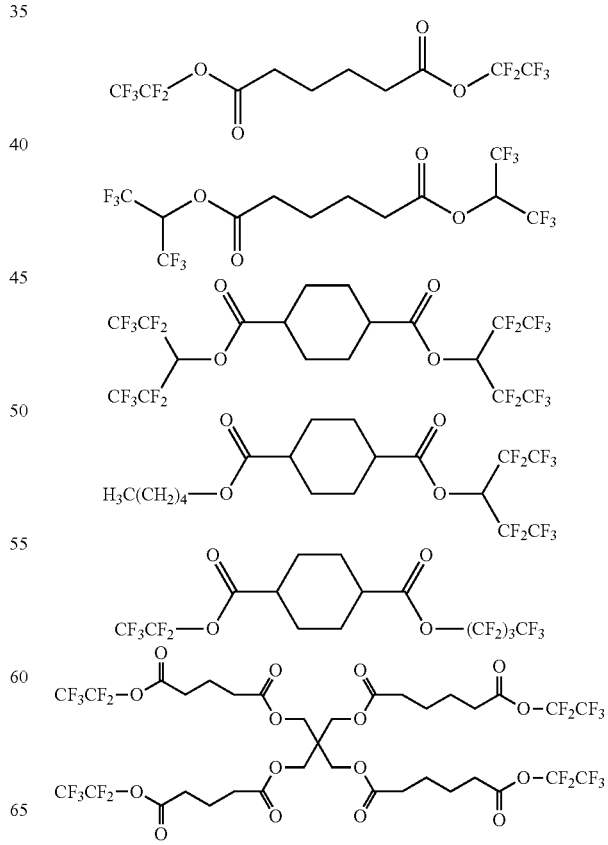

-continued

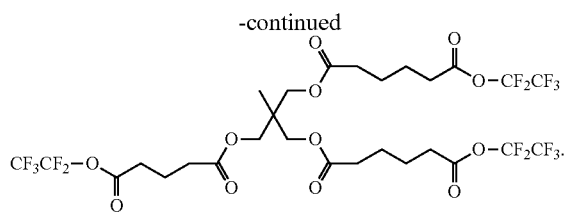

The photoresist compositions further include a solvent for dissolving the components of the composition and facilitating its coating on a substrate. Preferably, the solvent is an organic solvent conventionally used in the manufacture of electronic devices. Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane; alcohols such as methanol, ethanol, 1-propanol, iso-propanol, tert-butanol, 2-methyl-2-butanol and 4-methyl-2-pentanol; propylene glycol monomethyl ether (PGME), ethers such as diethyl ether, tetrahydrofuran, 1,4-dioxane and anisole; ketones such as acetone, methyl ethyl ketone, methyl iso-butyl ketone, 2-heptanone and cyclohexanone (CHO); esters such as ethyl acetate, n-butyl acetate, propylene glycol monomethyl ether acetate (PGMEA), ethyl lactate (EL), hydroxyisobutyrate methyl ester (HBM) and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof. The total solvent content (i.e., cumulative solvent content for all solvents) in the photoresist compositions is typically from 40 to 99 wt %, for example, from 70 to 99 wt %, or from 85 to 99 wt %, based on total weight of the photoresist composition. The desired solvent content will depend, for example, on the desired thickness of the coated photoresist layer and coating conditions.

The photoresist composition may further include one or more additional, optional additives. For example, optional additives may include one or more photo-decomposable quenchers (also known as photo-decomposable bases), basic quenchers in addition to the diamide quencher compounds described above, surfactants, resist stabilizers, actinic and contrast dyes, anti-striation agents, plasticizers, speed enhancers, sensitizers, and the like, or combinations thereof. If not otherwise stated below, the optional additives are typically present in the photoresist compositions in an amount of from 0.01 to 10 wt %, based on total solids of the photoresist composition.

Photo-decomposable quenchers generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds but paired with an anion of a weak acid (pKa>1) such as, for example, a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary carboxylic acids include p-toluene sulfonic acid, camphor sulfonic acid and the like. In a preferred embodiment, the photo-decomposable quencher is a photo-decomposable organic zwitterion compound such as diphenyllodonium-2-carboxylate.

Exemplary basic quenchers include, for example: linear aliphatic amines such as tributylamine, trioctylamine, triisopropanolamine, tetrakis(2-hydroxypropyl)ethylenediamine: n-tert-butyldiethanolamine, tris(2-acetoxy-ethyl) amine, 2,2',2'',2'''-(ethane-1,2-diylbis(azanetriyl))tetraethanol, 2-(dibutylamino)ethanol, and 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl) morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; imines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova. In an aspect, the photoresist composition further includes a surfactant polymer including a fluorine-containing repeating unit.

The photoresist compositions can be prepared following known procedures. For example, the compositions can be prepared by dissolving solid (non-solvent) components of the composition in the solvent component(s).

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Imaging (Marlborough, Mass.).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, 1,000 to 2,500 rpm, for a period of from 15 to 120 seconds to obtain a layer of the photoresist composition on the substrate. It will be appreciated by those skilled in the art that the thickness of the coated layer may be adjusted by changing the spin speed and/or the solids content of the composition. A thickness of the photoresist layer formed from the compositions of the invention can vary widely depending on the application. For certain applications, the resist can have a dried layer thickness of from 10 to 400 nanometers (nm), preferably from 15 to 200 nm, and more preferably from 50 to 100 nm.

The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the particular photoresist composition and thickness. The soft bake temperature is typically from 70 to 170° C., for example, from 70 to 150° C. The soft bake time is typically from 10 seconds to 20 minutes, for example, from 1 minute to 10 minutes, or from 1 minute to 5 minutes. The heating time can be readily determined by one of ordinary skill in the art based on the ingredients of the composition.

The photoresist layer is next pattern-wise exposed to activating radiation to create a difference in solubility between exposed and unexposed regions. Reference herein to exposing a photoresist composition to radiation that is activating for the composition indicates that the radiation is capable of forming a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nm, sub-300 nm or sub-200 nm, with 248 nm (KrF), 193 nm (ArF), and 13.5 nm (EUV) wavelengths or e-beam lithography being preferred. The methods find use in immersion or dry (non-immersion) lithography techniques. The exposure energy is typically from 1 to 200 millijoules per square centimeter (mJ/cm$^2$), preferably 10 to 100 mJ/cm$^2$ and more preferably 20 to 50 mJ/cm$^2$, dependent upon the exposure tool and components of the photoresist composition.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the particular photoresist composition and layer thickness. The PEB is typically conducted at a temperature of from 80 to 150° C., and a time of from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as tetramethylammonium hydroxide (TMAH), preferably 0.26 normal (N) TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof; and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching. The photoresist pattern may, for example, be used for pattern transfer to an underlying hardmask layer which, in turn, is used as an etch mask for pattern transfer to one or more layers below the hardmask layer. In another aspect, the photoresist pattern may be used as a mask for an ion implantation process, for example, for selectively introducing dopants into the substrate surface. If the photoresist pattern is not consumed during pattern transfer or implantation processes, it may be removed from the substrate by known techniques, for example, oxygen plasma ashing. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The photoresist compositions disclosed herein are exemplified by the following non-limiting examples.

EXAMPLE

Example 1

The various reactants used in these examples are shown below.
Polymer P1
The polymer P-1 is a copolymer of the repeat units shown below.

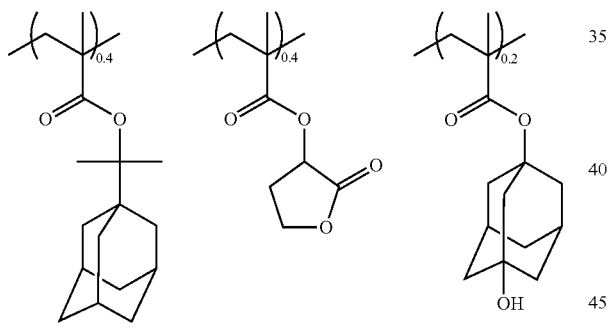

(P-1)

The values of 0.4, 0.4 and 0.2 respectively show the mole fraction of the respective repeat units in the copolymer.
Photo-Acid Generator PAG-1A Two photoacid generators triphenylsulfonium (adamantan-1-ylmethoxycarbonyl)-difluoromethanesulfonate) PAG-1A and (triphenylsulfonium camphorsulfonate) PAG-2A were used in the Examples.

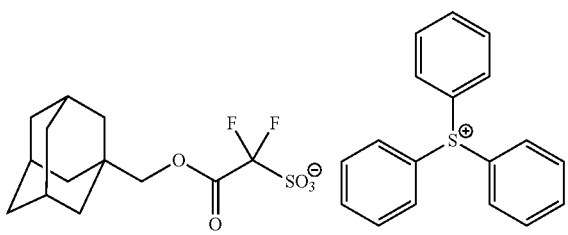

(PAG-1A)

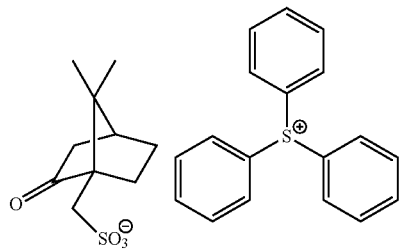

(PAG-2A)

Fluorinated polymer P-2 was prepared generally in accordance with the procedure described in US20180059545

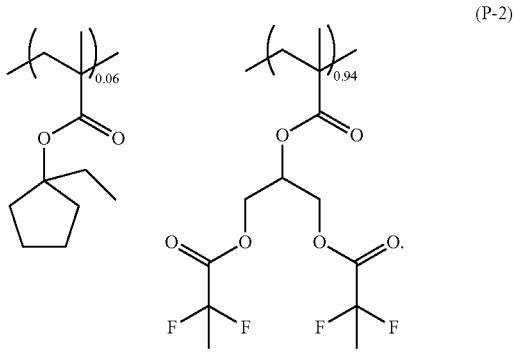

(P-2)

The polymer P-2 is a copolymer of the repeat units shown above. The values of 0.06 and 0.94 show the mole fractions of the repeat units in the copolymer.
Quencher Q-6

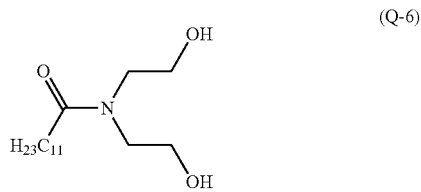

(Q-6)

(commercially available from Waco Chemicals).

All reactions were carried out under normal atmospheric conditions. All chemicals were used directly from the supplier. Nuclear magnetic resonance (NMR) spectra for all compounds were obtained on a 600 MHz spectrometer. The chemical shifts are reported in δ (ppm) values relative to internal deuterated acetone residual signal. Multiplicities are indicated by s (singlet), d (doublet), t (triplet), m (multiplet), dd (doublet of doublets), dt (doublet of triplets), tt (triplet of triplets), br (broad singlet). 2-[2-(2-aminoethoxy)ethoxy]ethanamine was purchased from Sigma-Aldrich Acetic acid was purchased from Fischer Scientific.

Synthesis of Quencher (N,N-(ethane-1,2,dylbis(oxy) bis(ethane-2,1-dyil)diacetamide) (Denoted as Q-1)

In a 500 mL round bottom flask equipped with a stirring bar, reflux condenser and thermometer, 2-[2-(2-aminoethoxy)ethoxy]ethanamine (10.0 g, 0.067 mol) (Sigma-Aldrich) was dissolved into 100 g of ethyl acetate. Concentrated acetic acid (0.4 g, 0.0067 mol) was added dropwise to the reaction mixture and all was stirred at room temperature for 10 minutes. The temperature was then raised to 77° C. and a clear solution was obtained. Reaction conversion was monitored through 1H-NMR and after 20 hours the reaction was deemed complete. Cooling the reaction mixture in a dry ice bath afforded a white precipitate that was filtered on a Buchner funnel and washed with cold ethyl acetate (−4° C., 50 mL) and room temperature methyl tert-butylether (100 mL). Drying of the precipitate under high vacuum overnight afforded 10.7 g of the product as a white powder (68%). $^1$H-NMR (500 MHz-Acetone-d6) 7.17 (br, 2H), 3.55 (s, 4H), 3.49 (t, 4H), 3.31 (q, 4H), 1.88 (s, 6H) ppm. $^{13}$C-NMR (125 MHz-Acetone-d6) 170.3, 70.94, 70.48, 39.9, 22.9 ppm.

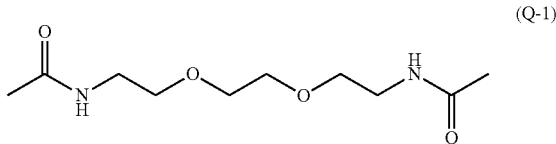 [SMILES: CC(=O)NCCOCCOCCNC(C)=O]

(Q-1)

Synthesis of Quencher (N,N'-((ethane-1,2-diylbis(oxy))bis(ethane-2,1-diyl))bis(3-methoxypropanamide) (Denoted as Q-2)

In a 500 mL round bottom flask equipped with a stirring bar, reflux condenser and thermometer, 2-[2-(2-aminoethoxy)ethoxy]ethanamine (6.0 g, 0.04 mol) (Sigma-Aldrich) was dissolved into 95.7 g of methyl-3methoxypropanoate. Concentrated acetic acid (0.122 g, 0.002 mol) was added dropwise to the reaction mixture and all was stirred at room temperature for 10 minutes. The temperature was then raised to 90° C. and all was stirred for 18 hours. Cooling the reaction mixture in a dry ice bath afforded a white precipitate that was filtered on a Buchner funnel and washed with cold Methyl tert-butylether (100 mL). Drying of the precipitate under high vacuum overnight afforded 10.1 g of the product as a white powder (77%). $^1$H-NMR (500 MHz-Acetone-d6) 7.14 (br, 2H), 3.59, (t, 4H), 3.56 (s, 4H), 3.50 (t, 4H), 3.33 (q, 4H), 3.27 (s, 6H), 2.38 (t, 4H) ppm. $^{13}$C-NMR (125 MHz-Acetone-d6) 171.1, 71.0, 70.5, 69.5, 58.6, 39.8, 37.3 ppm.

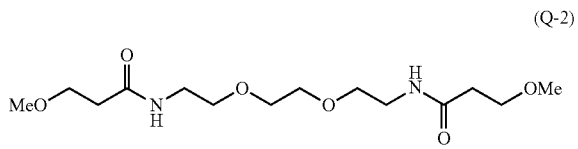 [SMILES: COCCC(=O)NCCOCCOCCNC(=O)CCOC]

(Q-2)

Synthesis of Quencher N,N'-(oxybis(ethane-2,1-diyl))diacetamide (Denoted as Q-3)

In a 100 mL round bottom flask equipped with a stirring bar, reflux condenser, a thermometer and a nitrogen inlet, 2-(2-aminoethoxy)ethanamine (3.0 g, 28 mmol) was dissolved into 43 g of ethyl acetate. Concentrated acetic acid (0.17 g, 0.0028 mol) was added to the reaction mixture and all was stirred at room temperature for 10 minutes. The temperature was then raised to 77° C. and the reaction conversion was monitored through $^1$H-NMR and after 29 hours the reaction was stopped. The crude mixture was passed through basic aluminum column. The obtained organic phase was then concentrated and cooled in a dry ice bath affording a white precipitate that was filtered on a Buchner funnel. Drying of the precipitate under high vacuum overnight afforded 2.0 g (37%) of the product as a white powder. $^1$H-NMR (500 MHz, CDCl$_3$) δ 6.47 (s, 2H), 3.53 (t, 4H), 3.41 (q, 4H), 2.00 (s, 6H). $^{13}$C-NMR (125 MHz, CDCl$_3$) δ 23.2, 39.2, 69.6, 170.6.

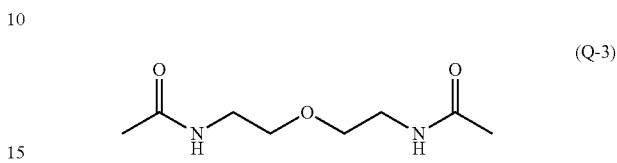

(Q-3)

Synthesis of Quencher N,N'-(thiobis(ethane-2,1-diyl))diacetamide (Denoted as Q-4)

In a 100 mL round bottom flask equipped with a stirring bar, reflux condenser, a thermometer, and a nitrogen inlet, 2,2'-thiobis(ethan-1-amine) (3.0 g, 25.0 mmol) was dissolved into 43 g of ethyl acetate. Concentrated acetic acid (0.2 g, 0.003 mol) was added to the reaction mixture and all was stirred at room temperature for 10 minutes. The temperature was then raised to 77° C. and the reaction conversion was monitored through 1H-NMR and after 29 hours the reaction was stopped. To the crude mixture was added methanol until obtaining a clear solution and all was passed through basic aluminum column. The obtained organic phase was then concentrated and cooled in a dry ice bath, affording a white precipitate that was filtered on a Buchner funnel. The product was re-crystalized in ethyl acetate/methanol by slowly evaporating the solvent. Drying of the precipitate under high vacuum overnight afforded 1.2 g of the product as a white powder (18%). H-NMR (400 MHz, D$_2$O) δ 3.32 (t, 4H), 2.65 (t, 4H), 1.93 (s, 6H). $^{13}$C NMR (125 MHz, D$_2$O) δ 21.8, 30.4, 38.7, 174.2 ppm.

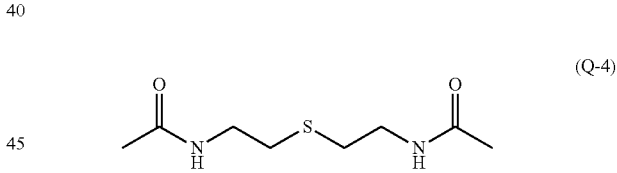

(Q-4)

Q-1, Q-2, Q-3 and Q-4 are the inventive quenchers that are used in the inventive compositions, whereas quenchers Q-5 and Q-6 are comparative quenchers.

Synthesis of Comparative Quencher N-(3-acetamidopropyl)-N-methylacetamide (Denoted as Q-5)

In a 100 mL round-bottom flask equipped with a stirring bar, N-methylthane-1,2-diamine (2.96, 0.04 mol) and acetic anhydride (9.53 g, 0.09 mol) were stirred at room temperature neat for 72 h. The reaction mixture was transferred to separatory funnel and a 1:1 mixture of water and tert-butyl alcohol was added, followed by solid sodium hydroxide. The organic phase was dried with sodium sulfate, collected and solvent removed using a rotary evaporator. Ammonium chloride (2 mL) and tert-butyl alcohol were added to the residue. Acetone was added until no more white precipitate formed. The precipitated product was isolated further dried on a vacuum pump, yielded 3.47 g of desired product.

$^1$H-NMR (500 MHz-Chloroform-d3) 6.82 (br, 1H), 3.45 (t, 2H), 3.18 (t, 2H), 2.97 (s, 3H), 2.05 (s, 3H), 1.98 (s, 3H), 1.62 (m, 2H) ppm.

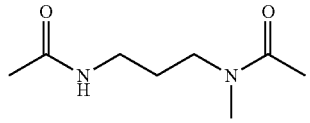

(Q-5)

General Preparation of the Photoresist Composition

The photoresist compositions (shown in the Table 1 below) were prepared by mixing the components listed in Table 1. Each mixture was filtered through a 0.2 μm PTFE disk. The numbers in parenthesis are the weights in parts per hundred. Solvent-1 is propylene glycol methyl ether acetate (PGMEA) and Solvent-2 is 2-hydroxy isobutyric acid methyl ester (HBM).

TABLE 1

| | Polymer A | Polymer B | PAG | PAG | Q | Solvent | Solvent |
|---|---|---|---|---|---|---|---|
| Example 1 | P1 (100) | P2 (3.8) | PAG-1A (20.5) | PAG-2A (2.3) | Q-1 (1.4) | Solvent-1 (2012) | Solvent-2 (2012) |
| Example 2 | P1 (100) | P2 (3.8) | PAG-1A (20.4) | PAG-2A (2.3) | Q-1 (1.3) | Solvent-1 (2008) | Solvent-2 (2008) |
| Example 3 | P1 (100) | P2 (3.8) | PAG-1A (20.5) | PAG-2A (2.3) | Q-2 (1.7) | Solvent-1 (2016) | Solvent-2 (2016) |
| Example 4 | P1 (100) | P2 (3.8) | PAG-1A (20.4) | PAG-2A (2.3) | Q-3 (1.0) | Solvent-1 (2003) | Solvent-2 (2003) |
| Example 5 | P1 (100) | P2 (3.8) | PAG-1A (20.4) | PAG-2A (2.3) | Q-4 (1.1) | Solvent-1 (2004) | Solvent-2 (2004) |
| Comparative Example 1 | P1 (100) | P2 (3.8) | PAG-1A (20.5) | PAG-2A (2.3) | Q-5 (1.7) | Solvent-1 (2016) | Solvent-2 (2016) |
| Comparative Example 2 | P1 (100) | P2 (3.8) | PAG-1A (20.6) | PAG-2A (2.3) | Q-6 (2.0) | Solvent-1 (2024) | Solvent-2 (2024) |

Lithographic Processing

The photo-resist manufactured from the photoresist compositions of the Table 1 were evaluated by lithography. A 300 millimeter (mm) silicon wafer was first spin-coated with a bottom anti-reflective coating AR™40 (DuPont Electronics & Imaging) and baked at 205° C. for 60 seconds to form an 80 nanometer (nm) film. A silicon-containing n-type reflective coating was then spin-coated on top and baked at 240° C. for 60 seconds to form a 22 nm film. Finally, the photoresist composition was spin-coated on top to form a 100 nm film and soft-baked at 85° C. for 60 seconds. The coated wafer was then exposed with ArF excimer laser (193 nm) through a mask pattern having dense spaces using an ArF exposure apparatus ASML/1900i, with 1.35 NA (numerical aperture), annular illumination and 0.8o/0.4i sigmas (where "o" and "i" are the outer and inner sigmas of the annular illumination). Thereafter, the wafer was baked at 95° C. for 60 seconds followed by development with 0.26N tetramethylammonium hydroxide (TMAH) solution and subsequent water wash. Critical dimension (CD) was determined by processing the images captured by top-down scanning electron microscopy (SEM) using a Hitachi CG-4000 CD-SEM. A 80 nm trench was targeted with a 80 nm/160 nm pitch mask. Focus latitude was evaluated by allowing +/−10% CD tolerance around the 80 nm target CD. If focus latitude was greater than 270 nm, it is denoted as A; if focus latitude was between 200 nm and 270 nm, it is denoted as B; and if the focus latitude was less than 200 nm, it is denoted as C. The focus latitude was evaluated for an 80 nm trench and the results are summarized in Table 2 below.

TABLE 2

| | Focus Latitude |
|---|---|
| Example 1 | A |
| Example 2 | A |
| Example 3 | B |
| Example 4 | A |
| Example 5 | A |
| Comparative Example 1 | B |
| Comparative Example 2 | C |

What is claimed is:

1. A photoresist composition, comprising:
a first polymer formed by free radical polymerization, the first polymer comprising polymerized units formed from a monomer comprising an ethylenically unsaturated double bond and an acid-labile group;
a photoacid generator;
a quencher of formula (1):

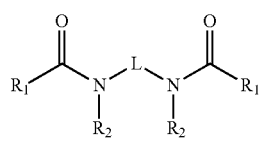

(1)

wherein: $R_1$ is independently a hydrogen atom, $C_1$-$C_{20}$ linear, $C_3$-$C_{20}$ branched, or $C_3$-20 cyclic alkyl, the alkyl optionally comprising an —O— group other than at an alpha-position with respect to the amide C(O), or $C_6$-$C_{20}$ aryl; $R_2$ is independently a hydrogen atom, $C_1$-$C_{20}$ linear, $C_3$-$C_{20}$ branched, or $C_3$-$C_{20}$ cyclic alkyl, or $C_6$-$C_{20}$ aryl; L is $C_1$-$C_{20}$ linear or $C_3$-$C_{20}$ branched alkylene comprising one or more heteroatom-containing groups independently selected from —O—, or —S—; wherein each of $R_1$, $R_2$, and L may independently be substituted or unsubstituted; wherein the quencher is free of crosslinkable groups; and
a solvent.

2. The photoresist composition of claim 1, wherein L comprises a plurality of heteroatom-containing groups.

3. The photoresist composition of claim 1, wherein the one or more heteroatom-containing groups is —O—.

4. The photoresist composition of claim 1, wherein each $R_1$ is a $C_1$-$C_{20}$ linear, $C_3$-$C_{20}$ branched, or $C_3$-$C_{20}$ cyclic alkyl, comprising an —O— group other than at an alpha-position with respect to the amide C(O).

5. The photoresist composition of claim 1, wherein the quencher is chosen from:

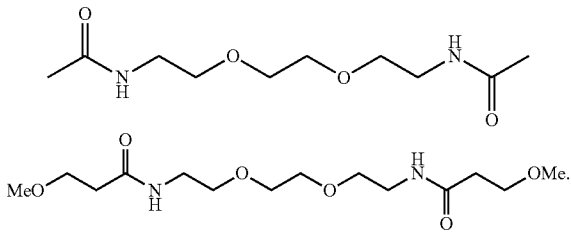

6. The photoresist composition of claim 1, wherein the first polymer comprises a (meth)acrylate polymer.

7. The photoresist composition of claim 1, further comprising a material that comprises one or more base-labile groups.

8. The photoresist composition of claim 1, wherein the first polymer further comprises polymerized units of the following formula:

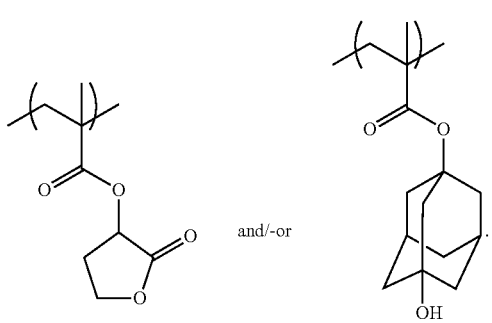

9. A pattern formation method, comprising:
(a) applying a layer of a photoresist composition of claim 1 on a substrate;
(b) pattern-wise exposing the photoresist composition layer to activating radiation; and
(c) developing the exposed photoresist composition layer to provide a resist relief image.

10. The pattern formation method of claim 9, further comprising transferring a pattern of the resist relief image to the substrate.

11. A photoresist composition, comprising:
a first polymer formed by free radical polymerization, the first polymer comprising polymerized units formed from a monomer comprising an ethylenically unsaturated double bond and an acid-labile group;
a photoacid generator;
a quencher of formula (1):

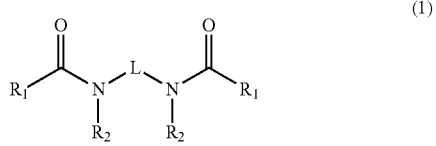

wherein: $R_1$ is independently a hydrogen atom, $C_1$-$C_{20}$ linear, $C_3$-$C_{20}$ branched, or $C_3$-20 cyclic alkyl, the alkyl optionally comprising an —O— group other than at an alpha-position with respect to the amide C(O), or $C_6$-$C_{20}$ aryl; $R_2$ is independently a hydrogen atom, $C_1$-$C_{20}$ linear, $C_3$-$C_{20}$ branched, or $C_3$-$C_{20}$ cyclic alkyl, or $C_6$-$C_{20}$ aryl; wherein L comprises a plurality of heteroatom-containing groups; L is $C_1$-$C_{20}$ linear or $C_3$-$C_{20}$ branched alkylene comprising one or more heteroatom-containing groups independently selected from —O—, or —S—, or —N($R_3$)—, wherein $R_3$ is selected from a hydrogen atom or $C_1$-$C_{20}$ linear or $C_3$-$C_{20}$ branched or cyclic alkyl; each of $R_1$, $R_2$, and L may independently be substituted or unsubstituted; wherein the quencher is free of crosslinkable groups; and a solvent.

* * * * *